(12) United States Patent
Feng et al.

(10) Patent No.: US 12,740,146 B2
(45) Date of Patent: Sep. 15, 2026

(54) DISPLAY SUBSTRATE INCLUDING HEAT DISSIPATION HOLE STRUCTURE AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 468 days.

(21) Appl. No.: 18/263,214

(22) PCT Filed: Jul. 28, 2022

(86) PCT No.: PCT/CN2022/108509
§ 371 (c)(1),
(2) Date: Jul. 27, 2023

(87) PCT Pub. No.: WO2024/020920
PCT Pub. Date: Feb. 1, 2024

(65) Prior Publication Data

US 2025/0063816 A1 Feb. 20, 2025

(51) Int. Cl.
*H10D 86/60* (2025.01)
*H10D 86/40* (2025.01)
(Continued)

(52) U.S. Cl.
CPC ........... *H10D 86/60* (2025.01); *H10D 86/441* (2025.01); *H10H 20/857* (2025.01); *H10H 20/8585* (2025.01); *H10W 90/00* (2026.01)

(58) Field of Classification Search
CPC .. H10D 86/60; H10D 86/441; H01L 25/0753; H10H 20/857; H10H 20/8585;
(Continued)

(56) References Cited

U.S. PATENT DOCUMENTS 7,701,132 B2 * 4/2010 Oh ........................ H10K 59/131
313/506
11,844,243 B2 * 12/2023 Jeon ...................... H10K 59/124
(Continued)

FOREIGN PATENT DOCUMENTS

CN 109690781 A 4/2019
CN 110289318 A 9/2019
(Continued)

OTHER PUBLICATIONS

First Korean Office Action for Korean Patent Application No. 10-2025-7006237 mailed Mar. 18, 2026. 10 pages.

*Primary Examiner* — Tan N Tran
(74) *Attorney, Agent, or Firm* — BROOKS KUSHMAN P.C.

(57) ABSTRACT

A display substrate and a display device. The display substrate comprises: a base substrate, and a gate driving circuit and a plurality of sub-pixels arranged on the base substrate; the display substrate further comprises a heat dissipation hole structure, and at least part of an orthographic projection of the heat dissipation hole structure onto the base substrate is located between an orthographic projection of the gate driving circuit onto the base substrate and an orthographic projection of the sub-pixels onto the base substrate.

19 Claims, 13 Drawing Sheets

(51) Int. Cl.
*H10H 20/857* (2025.01)
*H10H 20/858* (2025.01)
*H10W 90/00* (2026.01)

(58) Field of Classification Search
CPC ............... H10K 50/87; H10K 59/8794; H10K 59/1213; H10K 59/131; H10K 59/8052; H10K 59/873; H10W 90/00
See application file for complete search history.

(56) References Cited

U.S. PATENT DOCUMENTS

| | | | | |
|---|---|---|---|---|
| 2017/0236886 | A1* | 8/2017 | Matsueda ............ | H10K 59/124 257/40 |
| 2019/0165040 | A1 | 5/2019 | Dupont et al. | |
| 2020/0135771 | A1 | 4/2020 | Park et al. | |
| 2021/0066353 | A1 | 3/2021 | Su et al. | |

FOREIGN PATENT DOCUMENTS

| | | | |
|---|---|---|---|
| CN | 209496874 | U | 10/2019 |
| CN | 110400811 | A | 11/2019 |
| CN | 111787771 | A | 10/2020 |
| CN | 216120359 | U | 3/2022 |
| CN | 114299873 | A | 4/2022 |
| JP | 2008026866 | A | 2/2008 |
| WO | 2022000232 | A1 | 1/2022 |

* cited by examiner

DISPLAY SUBSTRATE INCLUDING HEAT DISSIPATION HOLE STRUCTURE AND DISPLAY DEVICE

CROSS-REFERENCE TO RELATED APPLICATION

This application is the U.S. national phase of PCT Application No. PCT/CN2022/108509 filed on Jul. 28, 2022, which is incorporated herein by reference in its entirety.

TECHNICAL FIELD

The present disclosure relates to the technical field of display, and more particularly, to a display substrate, and a display device.

BACKGROUND

With the development of display technology, the narrow frame of display products and the simplification of process have become the development direction of the display industry. In order to adapt to the above development direction, the technique of integrating a gate driving circuit composed of transistors onto a base substrate (Gate on Array, short for GOA) is usually used in display products.

SUMMARY

The objective of the present disclosure is to provide a display substrate and a display device.

In order to achieve the above objective, the present disclosure provides the following technical solutions.

In a first aspect of the present disclosure, a display substrate is provided, including: a base substrate, and a gate driving circuit and a plurality of sub-pixels arranged on the base substrate; where the display substrate further includes a heat dissipation hole structure, and at least part of an orthographic projection of the heat dissipation hole structure onto the base substrate is located between an orthographic projection of the gate driving circuit onto the base substrate and an orthographic projection of the sub-pixels onto the base substrate.

Optionally, the display substrate includes a display area and a border area surrounding the display area, the plurality of sub-pixels are located in the display area, and the gate driving circuit and the heat dissipation hole structure are located in the border area.

Optionally, the display substrate further includes a cathode layer, the cathode layer is located on a side of the gate driving circuit facing away from the base substrate, and a part of the cathode layer is located in the heat dissipation hole structure.

Optionally, the part of the cathode layer located in the heat dissipation hole structure is in contact with the base substrate.

Optionally, the display substrate further includes a heat conduction pattern, the heat conduction pattern is located in the heat dissipation hole structure, the heat conduction pattern is located between the cathode layer and the base substrate, and the heat conduction pattern is in contact with the cathode layer and the base substrate.

Optionally, a chamfering design is used for a corner part of an orthographic projection of the heat conduction pattern onto the base substrate.

Optionally, the heat conduction pattern includes at least two heat conduction sub-patterns that are stacked, one of the heat conduction sub-patterns closest to the base substrate is in contact with the base substrate, and one of the heat conduction sub-patterns farthest from the base substrate is in contact with the cathode layer.

Optionally, the heat conduction pattern includes a first heat conduction sub-pattern and a second heat conduction sub-pattern that are stacked, the first heat conduction sub-pattern is in contact with the base substrate, and the second heat conduction sub-pattern is in contact with the cathode layer; the first heat conduction sub-pattern is arranged in a same layer and made of a same material as a gate metal layer of the display substrate, and the second heat conduction sub-pattern is arranged in a same layer and made of a same material as a source and drain metal layer of the display substrate; and an area of the part of the cathode layer located in the heat dissipation hole structure is greater than an area of the first heat conduction sub-pattern, and is greater than an area of the second heat conduction sub-pattern.

Optionally, the display substrate includes a buffer layer, an interlayer insulating layer, a passivation layer, an organic insulating layer and a pixel definition layer that are stacked and arranged on the base substrate in sequence in a direction away from the base substrate, and the heat dissipation hole structure penetrates through the buffer layer, the interlayer insulating layer, the passivation layer, the organic insulating layer and the pixel definition layer.

Optionally, the display substrate further includes: a metal encapsulation layer, where the metal encapsulation layer is located on a side of the cathode layer facing away from the base substrate, and a part of the metal encapsulation layer is located in the heat dissipation hole structure.

Optionally, the display substrate further includes a first low-level signal line and a second low-level signal line, the first low-level signal line includes at least a portion extending along a first direction, the second low-level signal line includes at least a portion extending along the first direction, and an orthographic projection of the second low-level signal line onto the base substrate is located between the display area and an orthographic projection of the first low-level signal line onto the base substrate; the heat dissipation hole structure includes a plurality of first heat dissipation holes, and at least part of an orthographic projection of the first heat dissipation hole onto the base substrate is located between the orthographic projection of the gate driving circuit onto the base substrate and the orthographic projection of the first low-level signal line onto the base substrate.

Optionally, the display substrate further includes a plurality of first signal transmission lines, a plurality of second signal transmission lines and a plurality of first scanning lines, the first signal transmission line includes at least a portion extending along a second direction, the second signal transmission line includes at least a portion extending along the second direction, the first scanning line includes at least a portion extending along the second direction, and the second direction intersects with the first direction;

the first signal transmission line is coupled to a corresponding one of the gate driving circuit and the first low-level signal line, and the second signal transmission line is coupled to a corresponding one of the gate driving circuit and a corresponding one of the first scanning lines;

the orthographic projection of the first heat dissipation hole onto the base substrate is located between orthographic projections of one of the first signal transmission lines and one of the second signal transmission lines that are adjacent onto the base substrate.

Optionally, the orthographic projection of the first heat dissipation hole onto the base substrate is a rectangle, a long side of the rectangle has a length between 145 μm and 155 μm, and a short side of the rectangle has a length between 25 μm and 35 μm.

Optionally, the gate driving circuit includes pull-down transistors, and at least part of the orthographic projection of the first heat dissipation hole onto the base substrate is located between an orthographic projection of a corresponding one of the pull-down transistors onto the base substrate and the orthographic projection of the first low-level signal line onto the base substrate.

Optionally, the gate driving circuit includes output transistors, and at least part of the orthographic projection of the first heat dissipation hole onto the base substrate is located between orthographic projections of adjacent two of the output transistors onto the base substrate.

Optionally, the heat dissipation hole structure includes a plurality of second heat dissipation holes, at least part of an orthographic projection of the second heat dissipation hole onto the base substrate is located between the orthographic projection of the gate driving circuit onto the base substrate and the orthographic projection of the first low-level signal lines onto the base substrate, and the second heat dissipation holes and the first heat dissipation holes are alternately arranged along the first direction.

Optionally, the display substrate further includes a plurality of first signal transmission lines, a plurality of third signal transmission lines and a plurality of second scanning lines, the first signal transmission line includes at least a portion extending along a second direction, the third signal transmission line includes at least a portion extending along the second direction, the second scanning line includes at least a portion extending along the second direction, and the second direction intersects with the first direction;

the first signal transmission line is coupled to a corresponding one of the gate driving circuit and the first low-level signal line, and the third signal transmission line is coupled to a corresponding one of the gate driving circuit and a corresponding one of the second scanning lines;

the orthographic projection of the second heat dissipation hole onto the base substrate is located between orthographic projections of one of the first signal transmission lines and one of the third signal transmission lines that are adjacent onto the base substrate.

Optionally, the orthographic projection of the second heat dissipation hole onto the base substrate is a rectangle, a long side of the rectangle has a length between 145 μm and 155 μm, and a short side of the rectangle has a length between 10 μm and 20 μm.

Optionally, the gate driving circuit includes pull-down transistors, and at least part of the orthographic projection of the second heat dissipation hole onto the base substrate is located between an orthographic projection of a corresponding one of the pull-down transistors onto the base substrate and the orthographic projection of the first low-level signal line onto the base substrate.

Optionally, the gate driving circuit includes output transistors, and at least part of the orthographic projection of the second heat dissipation hole onto the base substrate is located between orthographic projections of adjacent two of the output transistors onto the base substrate.

Optionally, the heat dissipation hole structure includes a plurality of third heat dissipation holes, and at least part of an orthographic projection of the third heat dissipation hole onto the base substrate is located between the display area and the orthographic projection of the second low-level signal line onto the base substrate.

Optionally, the display substrate further includes a plurality of second signal transmission lines, a plurality of third signal transmission lines, a plurality of first scanning lines and a plurality of second scanning lines; the second signal transmission line includes at least a portion extending along a second direction, the third signal transmission line includes at least a portion extending along the second direction, the first scanning line includes at least a portion extending along the second direction, and the second scanning line includes at least a portion extending along the second direction; the second direction intersects the first direction;

the second signal transmission line is coupled to a corresponding one of the gate driving circuit and a corresponding one of the first scanning lines, and the third signal transmission line is coupled to a corresponding one of the gate driving circuit and a corresponding one of the second scanning lines;

the orthographic projection of the third heat dissipation hole onto the base substrate is located between orthographic projections of one of the second signal transmission lines and one of the third signal transmission lines that are adjacent onto the base substrate.

Optionally, the orthographic projection of the third heat dissipation hole onto the base substrate is a rectangle, a long side of the rectangle has a length between 150 μm and 160 μm, and a short side of the rectangle has a length between 60 μm and 70 μm.

Optionally, at least part of the orthographic projection of the third heat dissipation hole onto the base substrate is located between the orthographic projection of the second low-level signal line onto the base substrate and an orthographic projection of a corresponding one of the first scanning lines onto the base substrate; and/or at least part of the orthographic projection of the third heat dissipation hole onto the base substrate is located between the orthographic projection of the second low-level signal line onto the base substrate and an orthographic projection of a corresponding one of the second scanning lines onto the base substrate.

Optionally, the heat dissipation hole structure includes a plurality of fourth heat dissipation holes, and at least part of the orthographic projection of the fourth heat dissipation hole onto the base substrate is located between the display area and the orthographic projection of the second low-level signal line onto the base substrate; the fourth heat dissipation holes and the third heat dissipation holes are alternately arranged in the first direction.

Optionally, the orthographic projection of the fourth heat dissipation hole onto the base substrate is located between orthographic projections of one of the second signal transmission lines and one of the third signal transmission lines that are adjacent onto the base substrate.

Optionally, the orthographic projection of the fourth heat dissipation hole onto the base substrate is a rectangle, a long side of the rectangle has a length between 55 μm and 65 μm, and a short side of the rectangle has a length between 30 μm and 40 μm.

Optionally, the heat dissipation hole structure includes a plurality of fifth heat dissipation holes, at least part of the orthographic projection of the fifth heat dissipation hole onto the base substrate is located between the display area and the orthographic projection of the fourth heat dissipation hole onto the base substrate.

Optionally, the orthographic projection of the fifth heat dissipation hole onto the base substrate is located between orthographic projections of one of the first scanning lines and one of the second scanning lines that are adjacent onto the base substrate.

Optionally, the orthographic projection of the fifth heat dissipation hole onto the base substrate is a rectangle, a long side of the rectangle has a length between 170 μm and 180 μm, and a short side of the rectangle has a length between 110 μm and 120 μm.

Optionally, the gate driving circuit includes a first output transistor and a first capacitor, a first plate of the first capacitor is coupled to a gate electrode of the first output transistor, and a second plate of the first capacitor is coupled to a second electrode of the first output transistor; the heat dissipation hole structure includes a plurality of sixth heat dissipation holes, and the sixth heat dissipation hole penetrates through the first plate and the second plate.

Optionally, the gate driving circuit includes a second output transistor and a second capacitor, a third plate of the second capacitor is coupled to a gate electrode of the second output transistor, and a fourth plate of the second capacitor is coupled to a second electrode of the second output transistor; the heat dissipation hole structure includes a plurality of seventh heat dissipation holes, and the seventh heat dissipation hole penetrates through the third plate and the fourth plate.

Optionally, the gate driving circuit includes a first output transistor and a first capacitor, a first plate of the first capacitor is coupled to a gate electrode of the first output transistor, and a second plate of the first capacitor is coupled to a second electrode of the first output transistor; a first boundary of the cathode layer is between an orthographic projection of the first plate onto the base substrate and an orthographic projection of the third plate onto the base substrate.

Optionally, an orthographic projection of the first capacitor onto the base substrate and an orthographic projection of the second capacitor onto the base substrate are located between an orthographic projection of the first output transistor onto the base substrate and an orthographic projection of the second output transistor onto the base substrate.

Based on the technical solution of the display substrate, a second aspect of the present disclosure provides a display device including the above-mentioned display substrate.

BRIEF DESCRIPTION OF THE DRAWINGS

The accompanying drawings, which are included to provide a further understanding of the present disclosure and are incorporated in and constitute a part of the present disclosure, illustrate embodiments of the present disclosure and together with the description serve to explain the disclosure and do not constitute any undue limitation of the disclosure. In the drawings.

DETAILED DESCRIPTION

In order to further explain the display substrate and the display device provided by the embodiments of the present disclosure, a detailed description will be given below with reference to the accompanying drawings.

Figure 5:
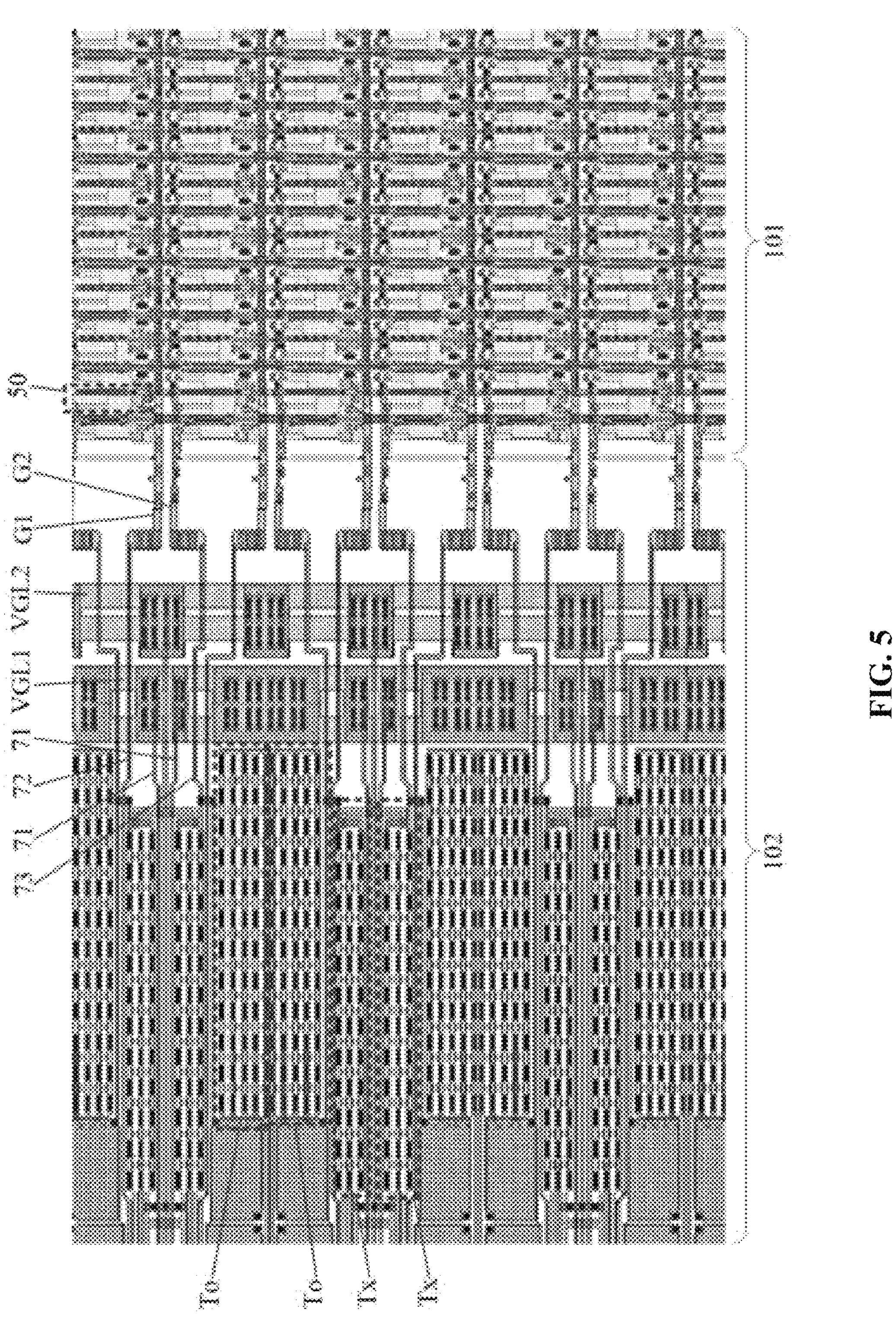
FIG. 5 is a schematic layout diagram of a sub-pixel and a gate driving circuit provided in an embodiment of the present disclosure.
Figure 6:
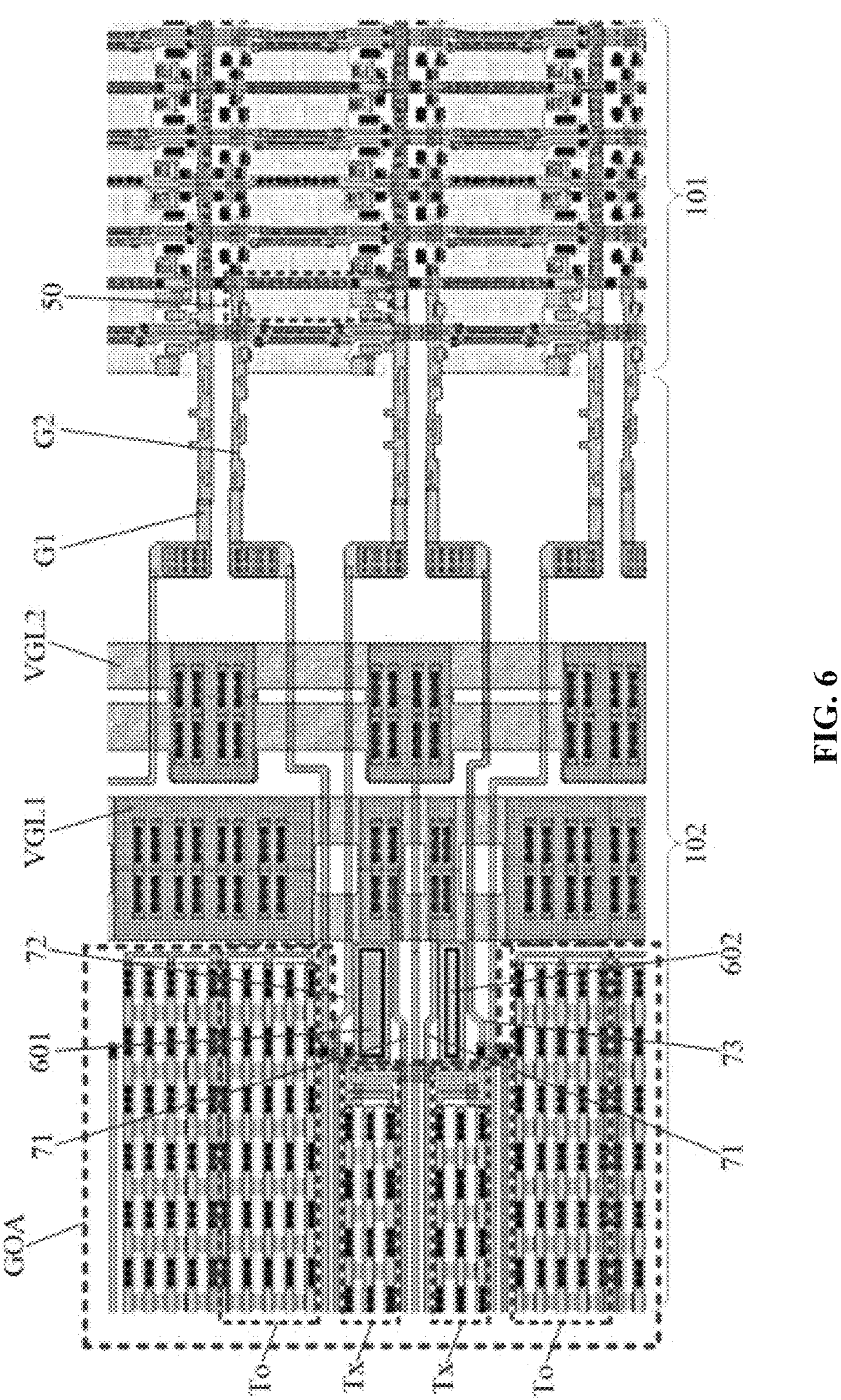
FIG. 6 is a schematic layout diagram of a first heat dissipation hole and a second heat dissipation hole provided in an embodiment of the present disclosure.
Figure 7:
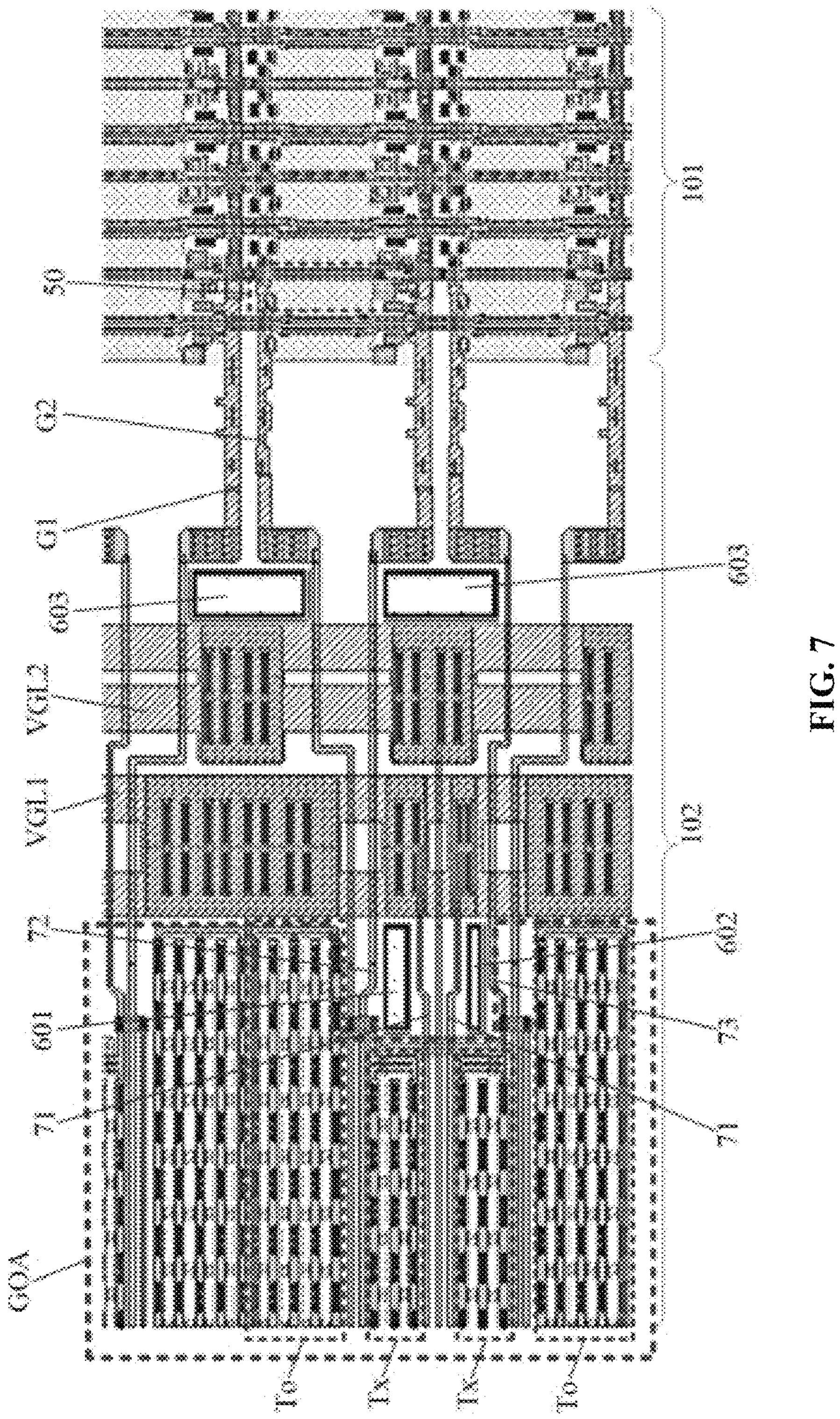
FIG. 7 is a schematic layout diagram of a first heat dissipation hole to a third heat dissipation hole provided in the embodiment of the present disclosure.
Figure 8:
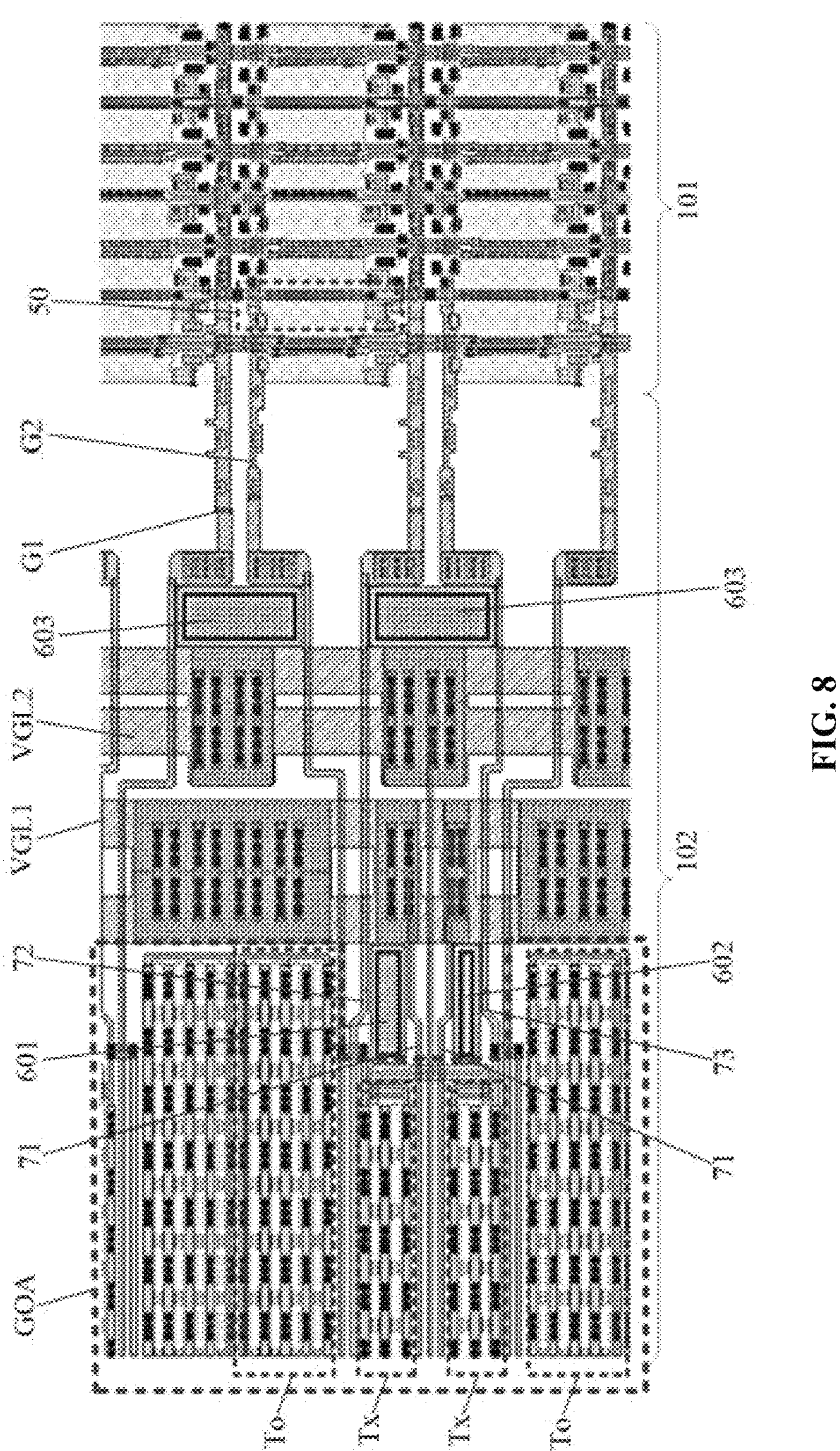
FIG. 8 is a schematic diagram of a first heat dissipation hole to a third heat dissipation hole provided with a heat conduction pattern provided in an embodiment of the present disclosure.
Figure 9:
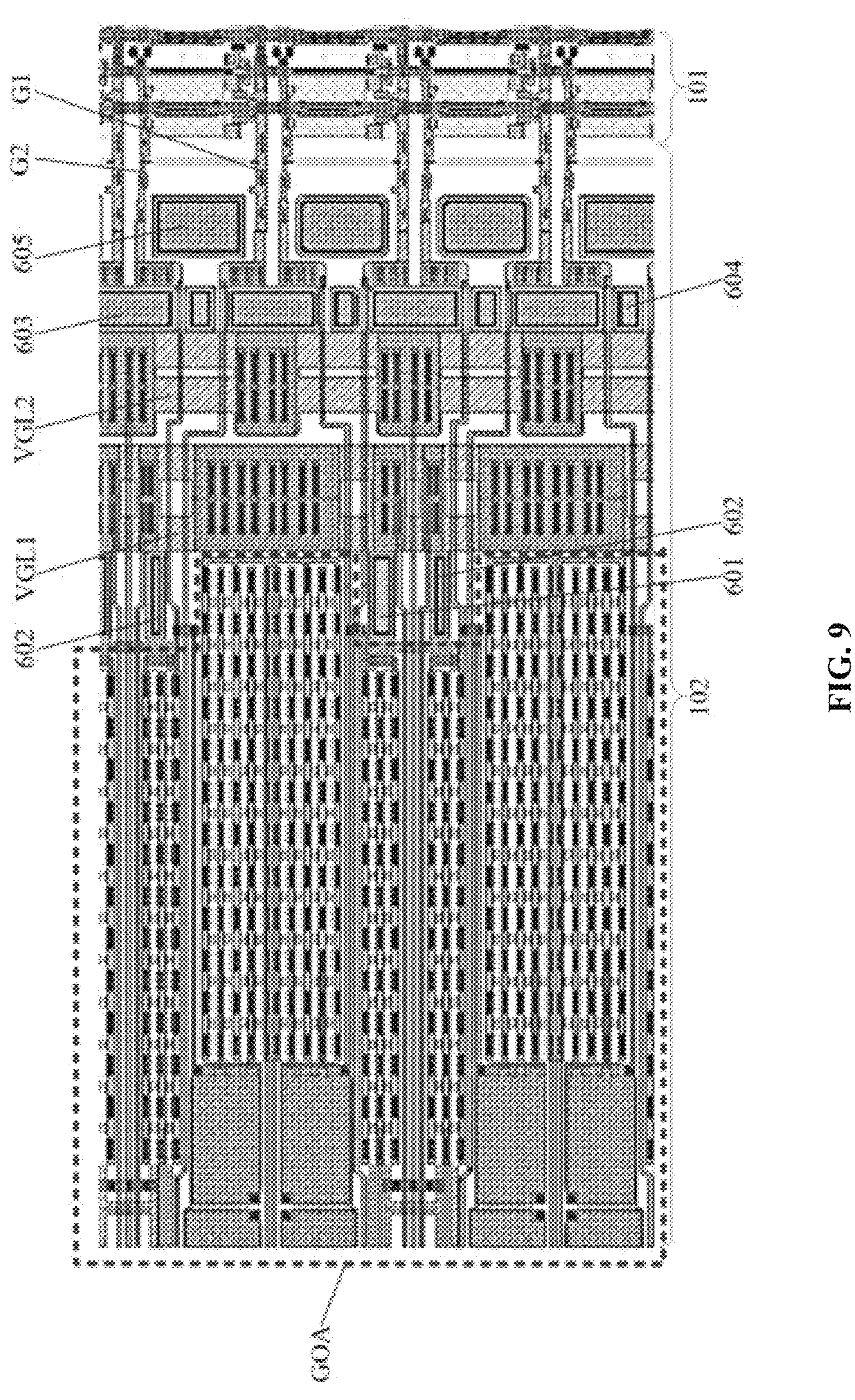
FIG. 9 is a schematic layout diagram of a first heat dissipation hole to a fifth heat dissipation hole provided in an embodiment of the present disclosure.

As shown in FIG. 5, the present disclosure provides a display substrate including a gate driving circuit GOA and a plurality of sub-pixels 50. The gate driving circuit GOA is configured to provide a gate driving signal for the sub-pixels 50. The output transistor To included in the gate driving circuit GOA has a relatively large channel width to length ratio, resulting in that the output transistor To generates a larger amount of heat when operating, and the dispersion of the heat may cause the sub-pixel 50 close to the gate driving circuit GOA to drift negatively, resulting in a situation where the sub-pixel 50 becomes brighter in a local area, adversely affecting the display brightness uniformity of the display substrate.

With reference to FIGS. 3, 4 and 6-12, an embodiment of the present disclosure provides a display substrate, including: a base substrate 10, and a gate driving circuit GOA and a plurality of sub-pixels 50 arranged on the base substrate 10; the display substrate further includes a heat dissipation hole structure 60 (including a first heat dissipation hole 601 to a seventh heat dissipation hole 607), and at least part of an orthographic projection of the heat dissipation hole structure 60 onto the base substrate 10 is located between an orthographic projection of the gate driving circuit GOA onto the base substrate 10 and an orthographic projection of the sub-pixel 50 onto the base substrate 10.

Illustratively, the sub-pixel 50 includes a sub-pixel driving circuit and a light-emitting element. The sub-pixel driving circuit is coupled to an anode of the light-emitting element. The gate driving circuit GOA is coupled to the sub-pixel driving circuit for providing a gate driving signal to the sub-pixel driving circuit, and the sub-pixel driving circuit is configured to provide a driving signal to the light-emitting element according to the gate driving signal, thereby to drive the light-emitting element to emit light.

As an example, the heat dissipation hole structure 60 may be provided at the periphery of the gate driving circuit GOA, for example, may be provided at the periphery of an output transistor To included in the gate driving circuit GOA, but is not limited thereto. The specific structure of the heat dissipation hole structure 60 is various, for example, the heat dissipation hole structure 60 may extend through at least part of an insulating layer or at least part of a conductive film layer on the display substrate. The heat generated in the operation of the gate driving circuit GOA can be dissipated through the heat dissipation hole structure 60.

According to the above-mentioned specific structure of the display substrate, it can be seen that in the display substrate provided in the embodiments of the present disclosure, at least part of the orthographic projection of the heat dissipation hole structure 60 onto the base substrate 10 is arranged between the orthographic projection of the gate driving circuit GOA onto the base substrate 10 and the orthographic projection of the sub-pixel 50 onto the base substrate 10, so that the gate driving circuit GOA can effectively dissipate heat through the heat dissipation hole structure 60, and it is avoided that the heat generated when the gate driving circuit GOA is operating has an influence on the sub-pixel 50. Thus, the uniformity of the display brightness of the sub-pixels 50 in the display substrate is ensured.

Referring to FIGS. 2, 3, 4 and 6 to 12, in some embodiments, the display substrate includes a display area 101 and a border area 102 surrounding the display area 101, the plurality of sub-pixels 50 are located in the display area 101, and the gate driving circuit GOA and the heat dissipation hole structure 60 are both located in the border area 102.

By way of example, the gate driving circuit GOA may be arranged on the left and right borders of the display substrate, but is not limited thereto.

By way of example, the heat dissipation hole structure 60 can be laid out on the left border and the right border, and the orthographic projection of the heat dissipation hole structure 60 onto the base substrate 10 is arranged to be located between the orthographic projection of the gate driving circuit GOA onto the base substrate 10 and the orthographic projection of the sub-pixel 50 onto the base substrate 10.

In the display substrate provided in the above-mentioned embodiments, by arranging the heat dissipation hole structure 60 in the border area 102, not only the heat dissipation hole structure 60 is arranged closer to the gate driving circuit GOA, facilitating heat dissipation of the gate driving circuit GOA, but also it can be avoided that the heat dissipation hole structure 60 occupies the space of the display area 101, ensuring the resolution of the display substrate.

Figure 3:
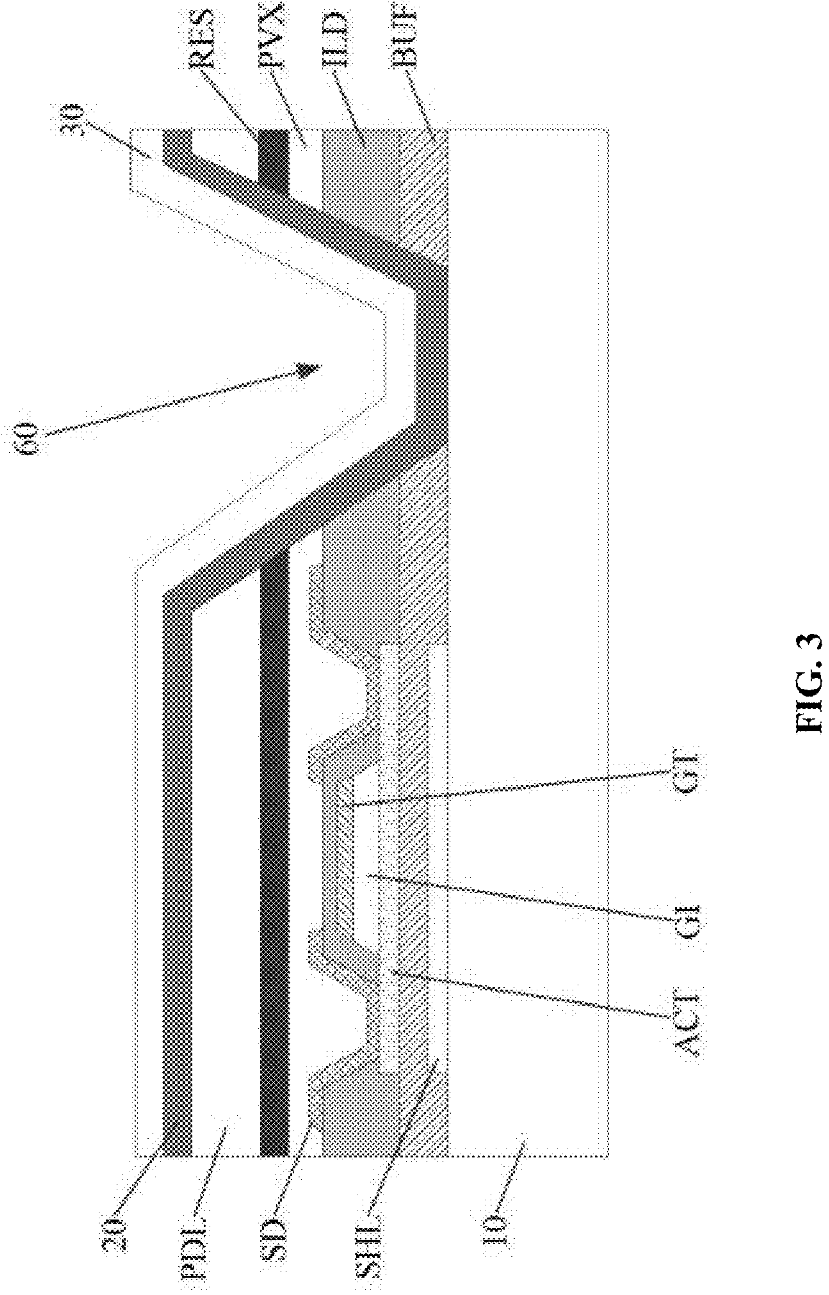
FIG. 3 is a schematic diagram of a first structure of a heat dissipation hole structure provided in an embodiment of the present disclosure.
Figure 4:
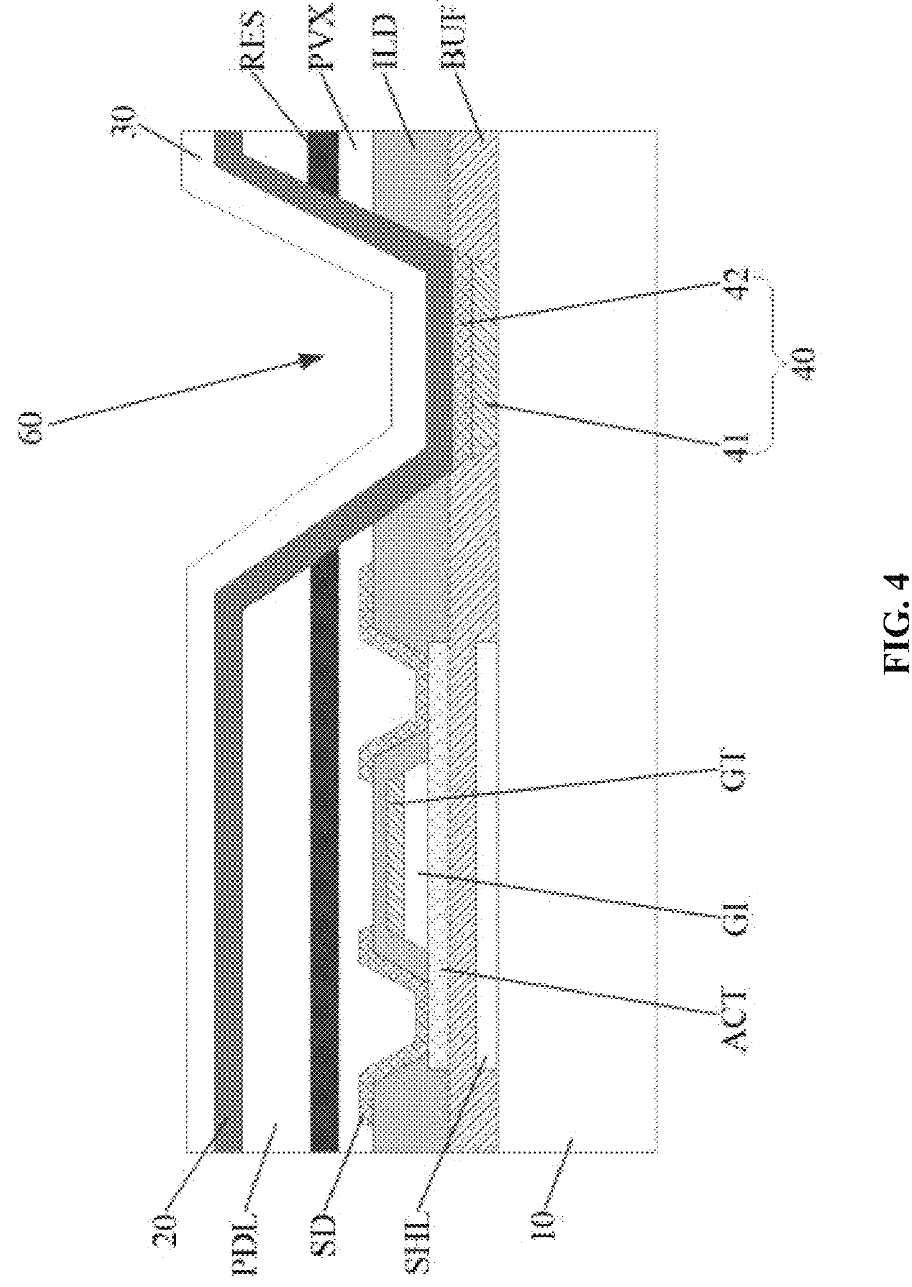
FIG. 4 is a schematic view of a second structure of a heat dissipation hole structure provided in an embodiment of the present disclosure.

As shown in FIGS. 3 and 4, in some embodiments, the display substrate further includes a cathode layer 20, the cathode layer 20 is located on a side of the gate driving circuit GOA facing away from the base substrate 10, a part of the cathode layer 20 is located within the heat dissipation hole structure 60.

Illustratively, the cathode layer 20 is made of a metal material, but not limited thereto.

Illustratively, the cathode layer 20 includes a portion at the display area 101 and a portion at the border area 102, and the portion of the cathode layer 20 at the border area 102 can be filled in the heat dissipation hole structure 60. For example, the cathode layer 20 is independent of the cathode layer of the display area 101.

Illustratively, the cathode layer 20 can extend from the display area 101 to the border area 102.

In the display substrate provided in the above-mentioned embodiments, by arranging a part of the cathode layer 20 in the heat dissipation hole structure 60, the heat inside the heat dissipation hole structure 60 can be dissipated through the cathode layer 20, thereby achieving a better heat dissipation effect.

As shown in FIGS. 3 and 4, in some embodiments, the cathode layer 20 within the heat dissipation hole structure 60 is in contact with the base substrate 10.

Illustratively, the heat dissipation hole structure 60 can expose the base substrate 10 after forming the heat dissipation hole structure 60 and before fabricating the cathode layer 20, and the cathode layer 20 can contact the base substrate 10 through the heat dissipation hole structure 60.

The above-mentioned cathode layer 20 arranged in the heat dissipation hole structure 60 is in contact with the base substrate 10, so that the cathode layer 20 is fully in contact with the inner wall of the heat dissipation hole structure 60, which is beneficial to improving the heat dissipation effect.

As shown in FIG. 4, in some embodiments, the display substrate further includes a heat conduction pattern 40, the heat conduction pattern 40 is located within the heat dissipation hole structure 60, the heat conduction pattern 40 is located between the cathode layer 20 and the base substrate 10, the heat conduction pattern 40 is in contact with the cathode layer 20 and the base substrate 10.

Illustratively, the heat conduction pattern 40 contacts or does not contact the inner wall of the heat dissipation hole structure 60.

By way of example, the heat conduction pattern 40 is arranged on the same layer and made of the same material as a portion of the conductive film layer of the display substrate, which can be formed simultaneously in the same patterning process.

Illustratively, the heat conduction pattern 40 is made of a metal material.

In the display substrate provided in the above-mentioned embodiments, by arranging a heat conduction pattern 40 inside the heat dissipation hole structure 60 and arranging the heat conduction pattern 40 to be in contact with the cathode layer 20 and the base substrate 10, heat generated by the gate driving circuit GOA can be dissipated through the heat dissipation hole structure 60, the heat conduction pattern 40 and the cathode layer 20, thereby effectively improving the capability of dissipating the heat generated by the gate driving circuit GOA.

Illustratively, the heat conduction patterns 40 arranged within the adjacent heat dissipation hole structures 60 are independent from each other, so that better heat dissipation of the gate driving circuit adjacent to the heat dissipation structure can be controlled more independently. For example, the heat conduction patterns 40 arranged inside the first heat dissipation hole 601 and the second heat dissipation hole 602 are independent from each other.

Figure 10:
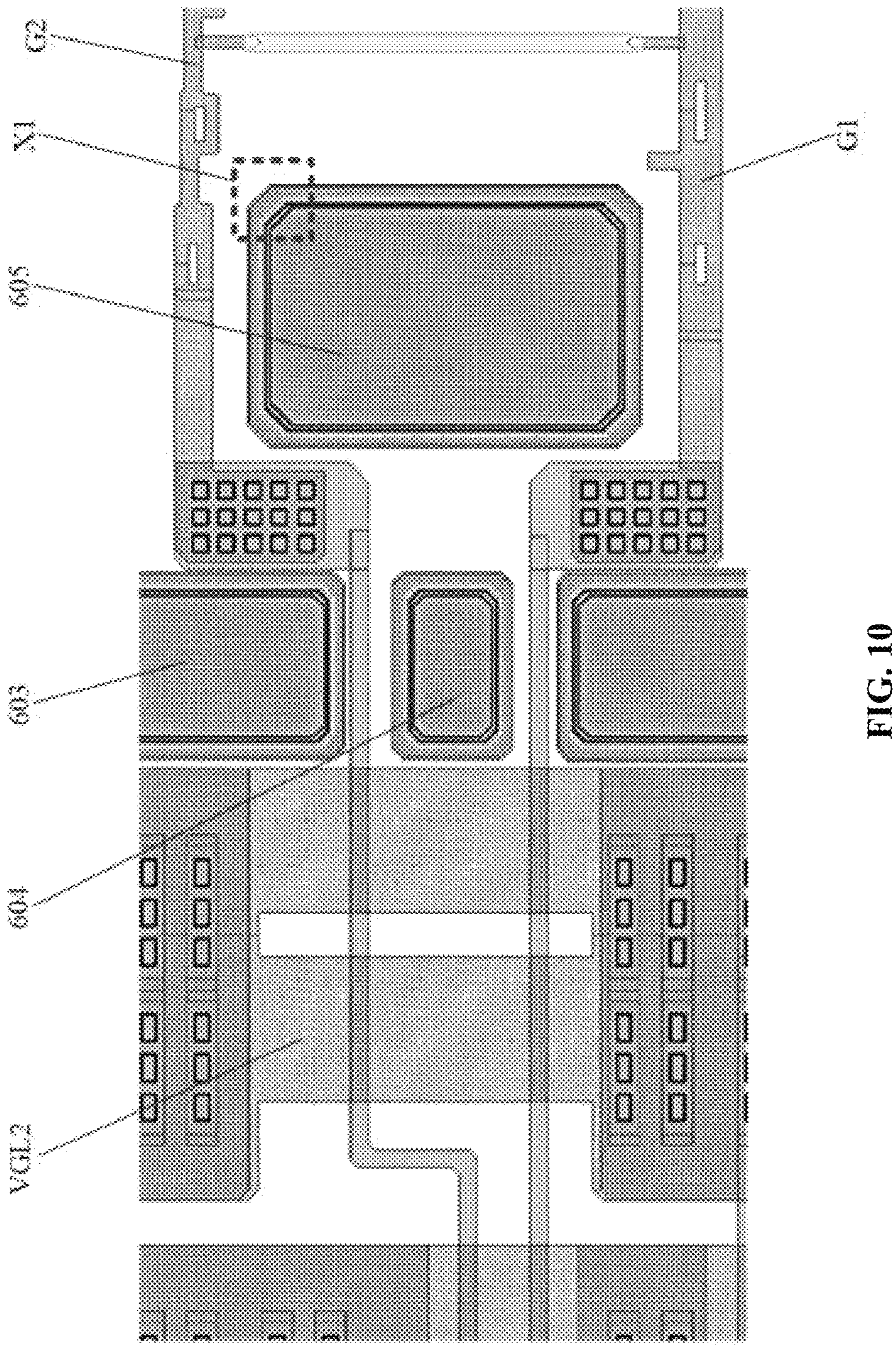
FIG. 10 is a schematic diagram of a heat conduction pattern using a chamfering design provided in an embodiment of the present disclosure.

As shown in FIG. 10, in some embodiments, the heat conduction pattern 40 employs a chamfering design X1 at the orthographic projections of the corner parts of onto the base substrate 10.

Illustratively, the orthographic projection of the heat conduction pattern 40 onto the base substrate 10 includes a rectangle, and the corner parts of the heat conduction pattern 40 adopt a chamfering design X1.

The above-mentioned chamfering design X1 is used for the orthographic projection of the corner parts of the heat conduction pattern 40 onto the base substrate 10, so as to avoid the electrostatic breakdown phenomenon caused by the accumulation of electrostatic charge due to the too sharp corner part of the heat conduction pattern 40.

As shown in FIG. 4, in some embodiments, the heat conduction pattern 40 includes at least two heat conduction sub-patterns that are arranged one by one, one of the heat conduction sub-patterns closest to the base substrate 10 is in contact with the base substrate 10 and one of the heat conduction sub-patterns furthest from the base substrate 10 is in contact with the cathode layer 20.

By way of example, the heat conduction sub-patterns can be formed simultaneously in the same patterning process as a portion of the conductive film layer of the display substrate. Illustratively, the heat conduction sub-patterns are made of a metal material.

In the display substrate provided in the above-mentioned embodiment, by arranging the heat conduction pattern to include the at least two heat conduction sub-patterns that are stacked, heat generated by the gate driving circuit GOA can be dissipated through the heat dissipation hole structure 60, the at least two heat conduction sub-patterns and the cathode layer 20, thereby effectively improving the heat dissipation capacity of the heat generated by the gate driving circuit GOA.

As shown in FIG. 4, in some embodiments, the heat conduction pattern 40 includes a first heat conduction sub-pattern 41 and a second heat conduction sub-pattern 42 that are stacked, where the first heat conduction sub-pattern 41 is in contact with the base substrate 10, and the second heat conduction sub-pattern 42 is in contact with the cathode layer 20. The first heat conduction sub-pattern 41 is arranged in a same layer and made of a same material as the gate metal layer of the display substrate, and the second heat conduction sub-pattern 42 is arranged in a same layer and made of a same material as the source and drain metal layer of the display substrate. The area of the cathode layer in the heat dissipation hole structure is greater than the area of the first heat conduction sub-pattern 41 and greater than the area of the second heat conduction sub-pattern 42.

In some embodiments, the first heat conduction sub-pattern 41 is arranged in the same layer and in the same material as a light shielding layer SHL in the display substrate, and the second heat conduction sub-pattern 42 is arranged in the same layer and in the same material as the gate metal layer GT or the source and drain metal layer SD in the display substrate.

In some embodiments, the heat conduction pattern 40 includes a third heat conduction sub-pattern (not shown), a first heat conduction sub-pattern 41, and a second heat conduction sub-pattern 42 that are stacked; the third heat conduction sub-pattern is in contact with the base substrate 10, and the third heat conduction sub-pattern is arranged in the same layer and in the same material as the light-shielding layer SHL in the display substrate; the first heat conduction sub-pattern 41 is located above the third heat conduction sub-pattern, and the first heat conduction sub-pattern 41 is arranged in the same layer and in the same material as a gate metal layer GT in the display substrate; the second heat conduction sub-pattern 42 is located above the first heat conduction sub-pattern 41, and is arranged in the same layer and material as the source and drain metal layer SD in the display substrate.

Illustratively, the display substrate includes a light-shielding layer SHL, a buffer layer BUF, an active layer ACT, a gate insulating layer G1, a gate metal layer GT, an interlayer insulating layer ILD, a source and drain metal layer SD, a passivation layer PVX, an organic insulating layer RES, an anode layer, a pixel definition layer PDL, a light-emitting functional layer, a cathode layer 20, an inorganic encapsulation layer and a metal encapsulation layer 30, which are sequentially stacked and arranged on the base substrate 10 in a direction away from the base substrate 10.

In the above-mentioned arrangement, the first heat conduction sub-pattern 41 and the gate metal layer of the display substrate are arranged in the same layer and made of the same material, so that the first heat conduction sub-pattern 41 can be formed simultaneously with the gate metal layer in a same patterning process, thereby effectively simplifying the manufacturing process flow of the display substrate and reducing the manufacturing cost of the display substrate.

The above-mentioned second heat conduction sub-pattern 42 and the source and drain metal layer are arranged in the same layer and made of the same material, so that the second heat conduction sub-pattern 42 can be formed simultaneously with the source and drain metal layer in a same patterning process, thereby effectively simplifying the manufacturing process flow of the display substrate and reducing the manufacturing cost of the display substrate.

As shown in FIGS. 3 and 4, in some embodiments, the display substrate includes a buffer layer BUF, an interlayer insulating layer ILD, a passivation layer PVX, an organic insulating layer RES and a pixel definition layer PDL which are stacked and arranged on the base substrate 10 in sequence along a direction away from the base substrate 10, and the heat dissipation hole structure 60 penetrates through at least one of the buffer layer BUF, the interlayer insulating layer ILD, the passivation layer PVX, the organic insulating layer RES and the pixel definition layer PDL. For example, the heat dissipation hole structure 60 penetrates through the passivation layer PVX, the organic insulating layer RES and the pixel definition layer PDL. In the display substrate provided in the above-mentioned embodiments, by arranging the heat dissipation hole structure 60 to penetrate through the buffer layer BUF, the interlayer insulating layer ILD, the passivation layer PVX, the organic insulating layer RES and the pixel definition layer PDL, the heat dissipation hole structure 60 has a relatively deep depth, heat accumulation between various layers is effectively avoided, and heat dissipation can be performed in time, thereby effectively improving the heat dissipation capacity of the heat dissipation hole structure 60.

Of course, it may be appreciated that when there are other insulating or metal layers between the display substrate cathode layer and the base substrate 10, the heat dissipation hole structure 60 may also extend through the insulating or metal layers to expose the base substrate 10.

As shown in FIG. 3 and FIG. 4, in some embodiments, the display substrate further includes: a metal encapsulation layer 30, where the metal encapsulation layer 30 is located on a side of the cathode layer 20 facing away from the base substrate 10, and a part of the metal encapsulation layer 30 is located in the heat dissipation hole structure 60.

Illustratively, the display substrate further includes an inorganic encapsulation layer (not shown in the figure), where the inorganic encapsulation layer is located between the cathode layer 20 and the metal encapsulation layer 30, and both the inorganic encapsulation layer and the metal encapsulation layer 30 have a portion located in the heat dissipation hole structure 60.

As shown in FIGS. 4 to 12, in some embodiments, the cathode layers 20 located within the heat dissipation hole structures 60 are independent of each other (e.g., the cathode layers 20 in the third heat dissipation hole 603, the fourth heat dissipation hole 604 and the fifth heat dissipation hole 605 are independent from each other); and the area of the cathode layer in the heat dissipation hole structure 60 is greater than the area of the first heat conduction sub-pattern 41 and is greater than the area of the second heat conduction sub-pattern 42. This independent design helps to prevent heat of the gate driving circuit adjacent to each heat dissipation hole from diffusing to other gate driving circuits around.

Alternatively, the area of the second heat conduction sub-pattern 42 is larger than the area of the first heat conduction sub-pattern 41.

The above-mentioned embodiment provides a display substrate, where a part of the metal encapsulation layer 30 is arranged in the heat dissipation hole structure 60, so that the heat generated by the gate driving circuit GOA can be dissipated through the heat dissipation hole structure 60, the metal encapsulation layer 30 and the cathode layer 20, thereby effectively improving the heat dissipation capacity of the heat generated by the gate driving circuit GOA.

As shown in FIGS. 4 to 9, in some embodiments, the display substrate also includes a first low-level signal line VGL1 and a second low-level signal line VGL2, the first low-level signal line VGL1 includes at least a portion extending along a first direction, the second low-level signal line VGL2 includes at least a portion extending along the first direction, and an orthographic projection of the second low-level signal line VGL2 onto the base substrate 10 is located between the orthographic projection of the first low-level signal line VGL1 onto the base substrate 10 and a display area 101. The heat dissipation hole structure 60 includes a plurality of first heat dissipation holes 601, and an orthographic projection of at least part of the first heat dissipation hole 601 onto the base substrate 10 is located between the orthographic projection of the gate driving circuit GOA onto the base substrate 10 and the orthographic projection of the first low-level signal line VGL1 onto the base substrate 10.

Illustratively, a level value of a first low-level signal transmitted by the first low-level signal line VGL1 is smaller than a level value of a second low-level signal transmitted by the second low-level signal line VGL2.

Illustratively, the first low-level signal line VGL1 is for transmitting a first low-level signal and the second low-level signal line VGL2 is for transmitting a second low-level signal. Illustratively, at the left border and the right border of the display substrate, the orthographic projection of the second low-level signal line VGL2 onto the base substrate 10 is located between the orthographic projection of the first low-level signal line VGL1 onto the base substrate 10 and the display area 101.

By way of example, the first low-level signal line VGL1 and/or the second low-level signal line VGL2 include two layers of metal patterns that are stacked and coupled to each other; the first metal pattern is made of a gate metal layer; the second metal pattern is made of a source and drain metal layer; the first metal pattern includes a plurality of hollowed-out areas; the second metal pattern includes a plurality of sub-patterns; the plurality of sub-patterns are arranged along the second direction; and the plurality of sub-patterns are respectively coupled to the first metal pattern.

Illustratively, the plurality of first heat dissipation holes 601 are aligned in the first direction. The plurality of first heat dissipation holes 601 are uniformly distributed in the first direction.

In the display substrate provided in the above-mentioned embodiments, at least part of the orthographic projection of the first heat dissipation holes 601 onto the base substrate 10 is arranged between the orthographic projection of the gate driving circuit GOA onto the base substrate 10 and the orthographic projection of the first low-level signal line VGL1 onto the base substrate 10, so that the first heat dissipation hole 601 is closer to the gate driving circuit GOA, thereby better facilitating the dissipation of heat generated in the gate driving circuit GOA, and effectively improving the heat dissipation effect of the first heat dissipation hole 601.

As shown in FIGS. 4 to 9, in some embodiments, the display substrate further includes a plurality of first signal transmission lines 71, a plurality of second signal transmission lines 72 and a plurality of first scanning lines G1, the first signal transmission line 71 includes at least a portion extending along a second direction, the second signal transmission line 72 includes at least a portion extending along the second direction, the first scanning line G1 includes at least a portion extending along a second direction, the second direction intersecting the first direction.

The first signal transmission line 71 is coupled to a corresponding one of the gate driving circuit GOA and the first low-level signal line VGL1, and the second signal transmission line 72 is coupled to a corresponding one of the gate driving circuit GOA and a corresponding first scanning line G1.

The orthographic projection of the first heat dissipation hole 601 onto the base substrate 10 is located between the orthographic projection of one of first signal transmission lines 71 and one of the second signal transmission lines 72 that are adjacent onto the base substrate 10.

Illustratively, the first direction includes a longitudinal direction and the second direction includes a transverse direction.

Figure 1:
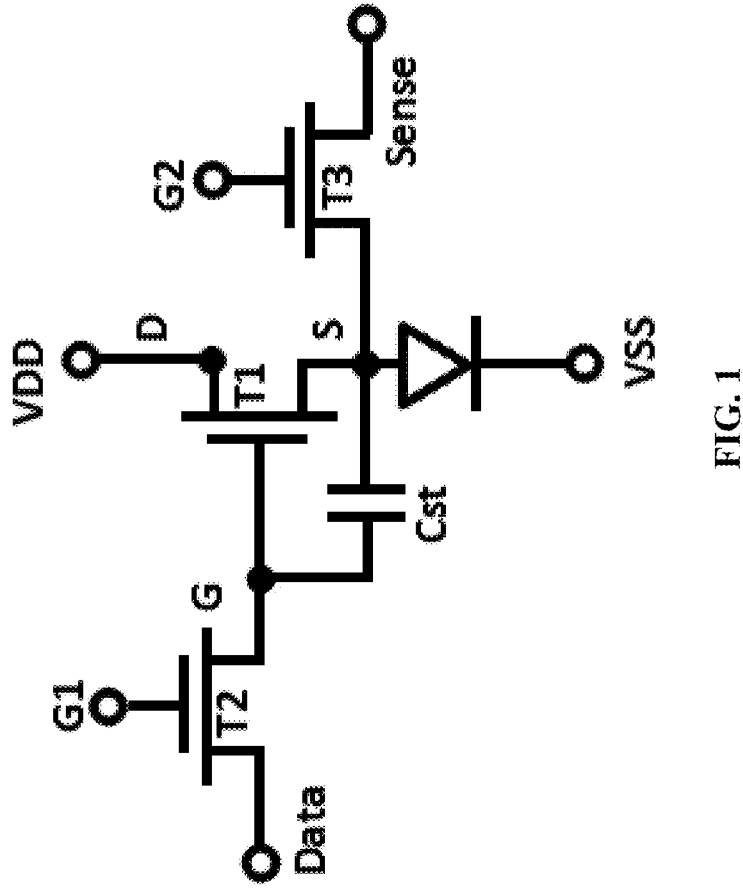
FIG. 1 is a circuit diagram of a sub-pixel driving circuit provided in an embodiment of the present disclosure.
Figure 2:
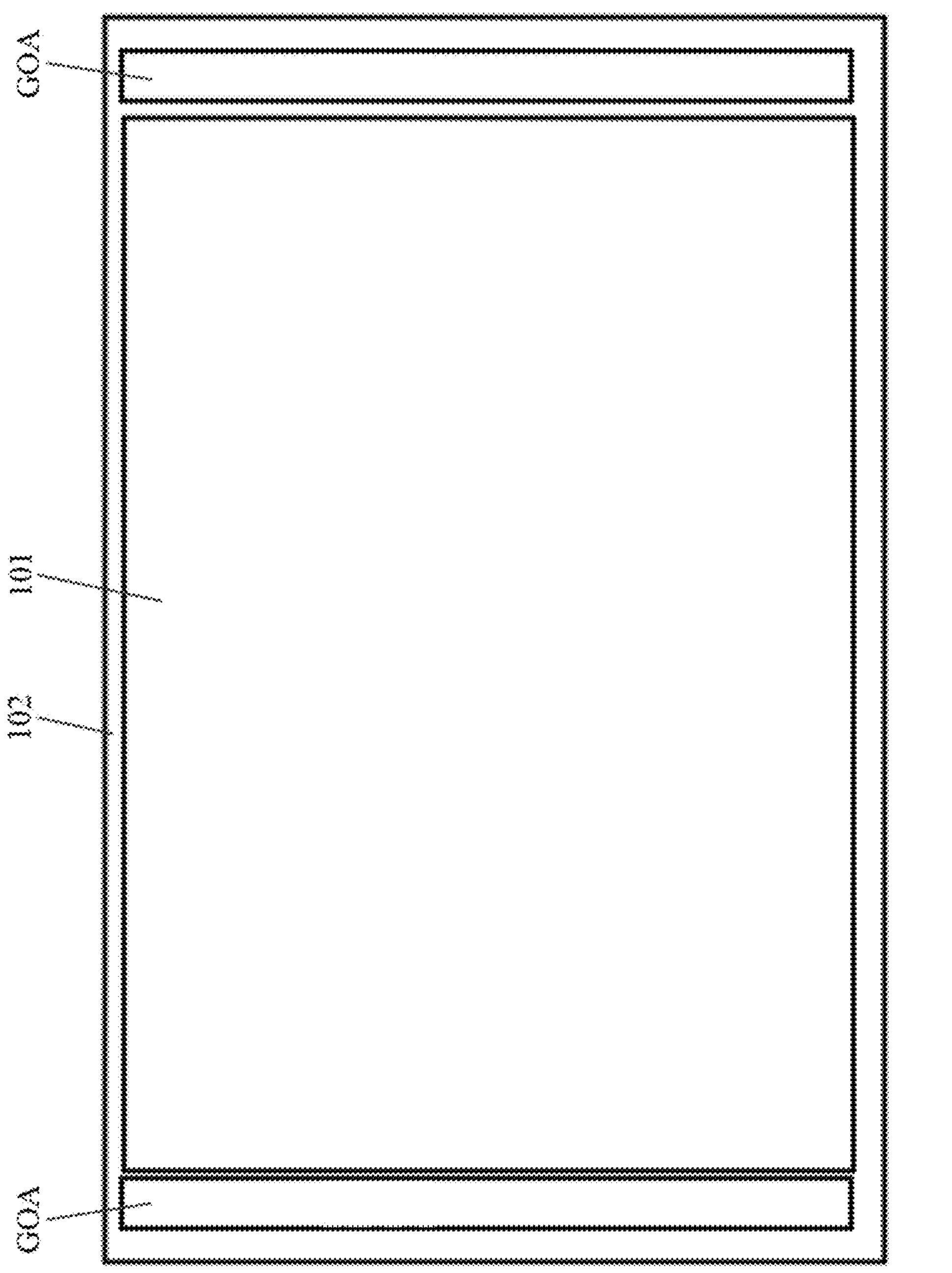
FIG. 2 is a schematic diagram showing a basic structure of a display substrate provided in an embodiment of the present disclosure.

As shown in FIG. 1, the sub-pixel driving circuit illustratively adopts a 3T1C structure, i.e., including three transistors and one capacitor, but is not limited thereto.

The sub-pixel drive circuit includes a first transistor T1, a second transistor T2, a third transistor T3 and a storage capacitor Cst. The display substrate includes a plurality of power supply lines VDD, a plurality of data lines Data, a plurality of sensing lines Sense, a plurality of first scanning lines G1 and a plurality of second scanning lines G2.

A first electrode of the first transistor T1 is coupled to the corresponding power supply line VDD, a second electrode of the first transistor T1 is coupled to an anode of the corresponding light-emitting element, and a cathode of the light-emitting element is used to receive the negative power supply signal VSS.

A gate electrode of the second transistor T2 is coupled to a corresponding first scanning line G1, a first electrode of the second transistor T2 is coupled to a corresponding data line Data, and a second electrode of the second transistor T2 is coupled to a gate electrode of the first transistor T1. The first scanning line G1 is coupled to a corresponding gate driving circuit and receives a first scanning signal provided by a corresponding one of the gate driving circuit, and the first scanning signal controls the turn-on and turn-off of the second transistor T2, so as to control whether to write a data signal provided by the data line Data into the gate electrode of the first transistor T1.

A gate electrode of the third transistor T3 is coupled to a corresponding second scanning line G2, a first electrode of the third transistor T3 is coupled to a second electrode of the first transistor T1, and a second electrode of the third transistor T3 is coupled to a corresponding sensing line Sense. The second scanning line G2 is coupled to a corresponding gate driving circuit, used to receive a second scanning signal provided by a corresponding one of the gate driving circuit, and the second scanning signal controls the turn-on and turn-off of the third transistor T3, so as to realize whether to sense the potential of the second electrode of the first transistor T1, and thus can realize the compensation for the sub-pixel driving circuit according to the potential.

A first end of the storage capacitor Cst is coupled to a gate electrode of the first transistor T1, and a second end of the storage capacitor Cst is coupled to a second electrode of the first transistor T1.

Illustratively, the first signal transmission line 71 and the second signal transmission line 72 are formed by using a source and drain metal layer, and the first scanning line G1 and the second scanning line G2 are formed by using a gate metal layer.

Illustratively, the first signal transmission line 71 and the second signal transmission line 72 are both located at a border area 102, and each of the first scanning line G1 and the second scanning line G2 includes a portion located at the display area 101 and a portion located at the border area 102.

Illustratively, the orthographic projection of the second signal transmission line 72 onto the base substrate 10 at least partially overlaps the orthographic projection of the first low-level signal line onto the base substrate 10. The orthographic projection of the second signal transmission line 72 onto the base substrate 10 at least partially overlaps the orthographic projection of the second low-level signal line onto the base substrate 10. The orthographic projection of the first scanning line G1 onto the base substrate 10 does not overlap with the orthographic projection of the first low-level signal line onto the base substrate 10. The orthographic projection of the second scanning line G2 onto the base substrate 10 does not overlap with the orthographic projection of the first low-level signal line onto the base substrate 10. The orthographic projection of the first scanning line G1 onto the base substrate 10 does not overlap with the orthographic projection of the second low-level signal line onto the base substrate 10. The orthographic projection of the second scanning line G2 onto the base substrate 10 does not overlap with the orthographic projection of the second low-level signal line onto the base substrate 10.

In the display substrate provided in the above-mentioned embodiments, there may be a relatively large layout space between the first signal transmission line 71 and the second signal transmission line 72 that are adjacent. By arranging that the orthographic projection of the first heat dissipation hole 601 onto the base substrate 10 is between orthographic projections of the first signal transmission line 71 and the second signal transmission line 72 that are adjacent onto the base substrate 10, not only the layout difficulty of the first heat dissipation hole 601 is reduced, but also the first heat dissipation hole 601 can achieve a relatively large size; it is advantageous to improve the heat dissipation performance of the first heat dissipation hole 601.

As shown in FIGS. 4 to 9, in some embodiments, the orthographic projection of the first heat dissipation hole 601 onto the base substrate 10 is a rectangle. A long side of the rectangle is between 145 μm and 155 μm, which may include endpoints, and a short side of the rectangle is between 25 μm and 35 μm, which may include endpoints.

Illustratively, the long side of the orthographic projection of the first heat dissipation hole 601 onto the base substrate 10 may take a value of: 147 μm, 149 μm, 150 μm, 152 μm, 154 μm, etc., but not limited thereto.

Illustratively, the short side of the orthographic projection of the first heat dissipation hole 601 onto the base substrate 10 may take a value of: 27 μm, 29 μm, 30 μm, 32 μm, 34 μm, etc., but not limited thereto.

By arranging the first heat dissipation holes 601 according to the above dimensions, it is possible to reduce the layout difficulty of the first heat dissipation holes 601 while ensuring the heat dissipation performance of the first heat dissipation holes 601.

As shown in FIGS. 4 to 9, in some embodiments, the gate driving circuit GOA includes a pull-down transistor Tx, and at least part of the orthographic projection of the first heat dissipation hole 601 onto the base substrate 10 is located between the orthographic projection of the corresponding pull-down transistor Tx onto the base substrate 10 and the orthographic projection of the first low-level signal line VGL1 onto the base substrate 10.

Illustratively, the number of the pull-down transistors Tx included in the gate driving circuit GOA may be set according to actual needs, and one gate driving signal output terminal of the gate driving circuit GOA may correspond to at least one pull-down transistor Tx. Illustratively, a first electrode of the pull-down transistor Tx is coupled to a corresponding gate driving signal output terminal, a second electrode of the pull-down transistor Tx is coupled to the second low-level signal line VGL2, and the pull-down transistor Tx is used for controlling the turn-on or turn-off the electrical connection between the corresponding gate driving signal output terminal and the second low-level signal line VGL2 under the control of a signal received by a control terminal thereof.

Illustratively, the gate driving circuit GOA includes two gate drive signal output terminals, each gate drive signal output terminal corresponds to two pull-down transistors Tx, and the pull-down transistors Tx has a larger channel width to length ratio.

In the display substrate provided in the above-mentioned embodiments, at least part of the orthographic projection of the first heat dissipation hole 601 onto the base substrate 10 is arranged between the orthographic projection of the corresponding pull-down transistor Tx onto the base substrate 10 and the orthographic projection of the first low-level signal line VGL1 onto the base substrate 10, so that the first heat dissipation hole 601 can better dissipate the heat generated during the operation of the pull-down transistor Tx, thereby better ensuring the display brightness uniformity of the display substrate.

In some embodiments, the gate driving circuit GOA includes an output transistor To, and at least part of the orthographic projection of the first heat dissipation hole 601 onto the base substrate 10 is located between the orthographic projections of adjacent output transistors To onto the base substrate 10.

Illustratively, the number of output transistors To included in the gate driving circuit GOA can be set according to actual needs, and one gate driving signal output terminal of the gate driving circuit GOA can correspond to one output transistor To. Illustratively, a first electrode of the output transistor To is coupled to a corresponding clock signal line, and a second electrode of the output transistor To is coupled to a corresponding gate driving signal output terminal, and the output transistor To is used for controlling to turn on or off the electrical connection between the corresponding gate driving signal output terminal and the clock signal line under the control of a signal received at a control terminal thereof.

Illustratively, the gate driving circuit GOA includes two gate drive signal output terminals, each gate drive signal output terminal corresponds to one output transistor To, and the output transistor To has a larger channel width to length ratio.

In the display substrate provided in the above-mentioned embodiments, by arranging that at least part of the orthographic projection of the first heat dissipation hole 601 onto the base substrate 10 is located between the orthographic projections of adjacent output transistors To onto the base substrate 10, the first heat dissipation hole 601 can better dissipate the heat generated in the operation of the output transistors To, thereby better ensuring the display brightness uniformity of the display substrate.

As shown in FIGS. 4 to 9, in some embodiments, the heat dissipation hole structure 60 includes a plurality of second heat dissipation holes 602, where an orthographic projection of at least part of the second heat dissipation hole 602 onto the base substrate 10 is located between the orthographic projection of the gate driving circuit GOA onto the base substrate 10 and the orthographic projection of the first low-level signal line VGL1 onto the base substrate 10, and the second heat dissipation holes 602 and the first heat dissipation holes 601 are alternately arranged along the first direction.

Illustratively, the plurality of second heat dissipation holes 602 are distributed in the first direction. The plurality of second heat dissipation holes 602 are uniformly distributed in the first direction.

In the display substrate provided in the above-mentioned embodiments, at least part of the orthographic projection of the second heat dissipation hole 602 onto the base substrate 10 is arranged between the orthographic projection of the gate driving circuit GOA onto the base substrate 10 and the orthographic projection of the first low-level signal line VGL1 onto the base substrate 10, so that the second heat dissipation hole 602 is closer to the gate driving circuit GOA, thereby better facilitating the dissipation of heat generated in the gate driving circuit GOA, and effectively improving the heat dissipation effect of the second heat dissipation hole 602.

In the display substrate provided in the above-mentioned embodiments, the second heat dissipation holes 602 and the first heat dissipation holes 601 are alternately arranged along the first direction, so that the first heat dissipation holes 601 and the second heat dissipation holes 602 can be uniformly distributed along the first direction, thereby better improving the heat dissipation performance of the heat dissipation hole structure 60.

As shown in FIGS. 4 to 9, in some embodiments, the display substrate further includes a plurality of first signal transmission lines 71, a plurality of third signal transmission lines 73 and a plurality of second scanning lines G2, the first signal transmission lines 71 includes at least a portion extending along a second direction, the third signal transmission line 73 includes at least a portion extending along the second direction, the second scanning lines G2 includes at least a portion extending along a second direction, the second direction intersecting the first direction.

The first signal transmission line 71 is coupled to a corresponding one of the gate driving circuit GOA and the first low-level signal line VGL1, and the third signal transmission line 73 is coupled to a corresponding one of the gate driving circuit GOA and a corresponding second scanning line G2.

An orthographic projection of the second heat dissipation hole 602 onto the base substrate 10 is located between an orthographic projection of one of the first signal transmission lines 71 onto the base substrate 10 and an orthographic projection of the third signal transmission line 73 adjacent to the first signal transmission line 71 onto the base substrate 10.

Illustratively, the third signal transmission line 73 is formed by using a source and drain metal layer.

Illustratively, the third signal transmission line 73 is located in the border area 102.

Illustratively, the orthographic projection of the third signal transmission line 73 onto the base substrate 10 at least partially overlaps the orthographic projection of the first low-level signal line onto the base substrate 10. The orthographic projection of the third signal transmission line 73 onto the base substrate 10 at least partially overlaps the orthographic projection of the second low-level signal line onto the base substrate 10.

In the display substrate provided in the above-mentioned embodiments, there can be a relatively large layout space between the first signal transmission line 71 and the third signal transmission line 73 that are adjacent to each other. By arranging that the orthographic projection of the second heat dissipation hole 602 onto the base substrate 10 is located between orthographic projections of one of the first signal transmission lines 71 and one of the third signal transmission lines 73 that are adjacent onto the base substrate 10, not only the difficulty of layout of the second heat dissipation hole 602 is reduced, but also the second heat dissipation hole 602 can achieve a relatively large size; it is advantageous to improve the heat dissipation performance of the second heat dissipation hole 602.

As shown in FIGS. 4 to 9, in some embodiments, there may be a larger layout space between the second signal transmission line 72 and the third signal transmission line 73 that are adjacent, and at least the first heat dissipation hole 601 and/or second heat dissipation hole 602 can be provided. For example, the second signal transmission line 72 is electrically connected to a first scanning line G1 of the corresponding M-th row of pixels, and the third signal transmission line 73 is electrically connected to a second scanning line G2 of the corresponding (M+1)-th row of pixels, so that a heat dissipation structure is designed to facilitate heat dissipation of gate driving circuits corresponding to different rows of pixels.

As shown in FIGS. 4 to 9, in some embodiments, the orthographic projection of the second heat dissipation hole 602 onto the base substrate 10 is a rectangle having a long side between 145 μm and 155 μm, which may include endpoints, and a short side between 10 μm and 20 μm, which may include endpoints.

Illustratively, the long side of the orthographic projection of the second heat dissipation hole 602 onto the base substrate 10 may take a value of: 147 μm, 149 μm, 150 μm, 152 μm, 154 μm, etc., but not limited thereto.

Illustratively, the short side of the orthographic projection of the second heat dissipation hole 602 onto the base substrate 10 may take a value: 12 μm, 14 μm, 16 μm, 18 μm, 19 μm, etc., but not limited thereto.

By arranging the second heat dissipation holes 602 according to the above dimensions, the layout difficulty of the second heat dissipation holes 602 can be reduced while ensuring the heat dissipation performance of the second heat dissipation holes 602.

As shown in FIGS. 4 to 9, in some embodiments, the gate driving circuit GOA includes a pull-down transistor Tx, and at least part of the orthographic projection of the second heat dissipation hole 602 onto the base substrate 10 is located between the orthographic projection of the corresponding pull-down transistor Tx onto the base substrate 10 and the orthographic projection of the first low-level signal line VGL1 onto the base substrate 10.

In the display substrate provided in the above-mentioned embodiments, at least part of the orthographic projection of the second heat dissipation hole 602 onto the base substrate 10 is arranged between the orthographic projection of the corresponding pull-down transistor Tx onto the base substrate 10 and the orthographic projection of the first low-level signal line VGL1 onto the base substrate 10, so that the second heat dissipation hole 602 can better dissipate the heat generated during the operation of the pull-down transistor Tx, thereby better ensuring the display brightness uniformity of the display substrate.

As shown in FIGS. 4 to 9, in some embodiments, the gate driving circuit GOA includes an output transistor To, and at least part of the orthographic projection of the second heat dissipation hole 602 onto the base substrate 10 is located between the orthographic projections of adjacent output transistors To onto the base substrate 10.

In the display substrate provided in the above-mentioned embodiments, by arranging that at least part of the orthographic projection of the second heat dissipation hole 602 onto the base substrate 10 is located between the orthographic projections of adjacent output transistors To onto the base substrate 10, the second heat dissipation hole 602 can better dissipate the heat generated in the operation of the output transistors To, thereby better ensuring the display brightness uniformity of the display substrate.

As shown in FIGS. 4 to 9, in some embodiments, the heat dissipation hole structure 60 includes a plurality of third heat dissipation holes 603, at least part of the orthographic projection of the third heat dissipation hole 603 onto the base substrate 10 is located between the orthographic projection of the second low-level signal lines VGL2 onto the base substrate 10 and the display area 101.

Illustratively, at least part of the orthographic projection of the third heat dissipation hole 603 onto the base substrate 10 is located between the orthographic projection of the output transistor To onto the base substrate 10 and the display area 101.

In the display substrate provided in the above-mentioned embodiment, at least part of the orthographic projection of the third heat dissipation hole 603 onto the base substrate 10 is arranged between the orthographic projection of the second low-level signal line VGL2 onto the base substrate 10 and the display area 101, and the heat in the vicinity of the display area 101 can be dissipated via the third heat dissipation hole 603, effectively blocking the transmission path of the heat to the display area, which is beneficial to further improve the display brightness uniformity of the display substrate.

As shown in FIGS. 4 to 9, in some embodiments, the display substrate further includes a plurality of second signal transmission lines 72, a plurality of third signal transmission lines 73, a plurality of first scanning lines G1 and a plurality of second scanning lines G2; the second signal transmission line 72 includes at least a portion extending along a second direction, the third signal transmission line 73 includes at least a portion extending along the second direction, the first scanning line G1 includes at least a portion extending along the second direction, and the second scanning line G2 includes at least a portion extending along the second direction; the second direction intersects the first direction.

The second signal transmission line 72 is coupled to a corresponding the gate driving circuit GOA and a corresponding first scanning line G1, and the third signal transmission line 73 is coupled to a corresponding the gate driving circuit GOA and a corresponding second scanning line G2.

The orthographic projection of the third heat dissipation hole 603 onto the base substrate 10 is located between the orthographic projection of the second signal transmission line 72 onto the base substrate 10 and the orthographic projection of the third signal transmission line 73 adjacent to the second signal transmission line 72 onto the base substrate 10.

In the display substrate provided in the above-mentioned embodiments, there may exist a relatively large layout space between the second signal transmission line 72 and the third signal transmission line 73 that are adjacent, and by arranging that the orthographic projection of the third heat dissipation hole 603 onto the base substrate 10 is located between orthographic projections of the second signal transmission line 72 the orthographic projection of the third signal transmission line 73 that are adjacent onto the base substrate 10, not only the layout difficulty of the third heat dissipation hole 603 is reduced, but also the third heat dissipation hole 603 can achieve a relatively large size. It is advantageous to improve the heat dissipation performance of the third heat dissipation hole 603.

As shown in FIGS. 4 to 9, in some embodiments, the third heat dissipation hole 603 corresponds to a coupling position on the base substrate 10 where the second signal transmission line 72 and the first scanning line G1 at different layers are connected through a via hole, and corresponds to a coupling position on the base substrate 10 where the third signal transmission line 73 and the second scanning line G2 at different layers are connected through a via hole, which helps to dissipate the heat generated by the metal at the coupling positions.

As shown in FIGS. 4 to 9, in some embodiments, the orthographic projection of the third heat dissipation hole 603 onto the base substrate 10 is a rectangle having a long side between 150 μm and 160 μm, which may include endpoints, and a short side between 60 μm and 70 μm, which may include endpoints.

By way of example, the length of the long side of the orthographic projection of the third heat dissipation hole 603 onto the base substrate 10 may take a value: 152 μm, 154 μm, 156 μm, 158 μm, 159 μm, etc., but not limited thereto.

Illustratively, the length of the short side of the orthographic projection of the third heat dissipation hole 603 onto the base substrate 10 may take a value of: 62 μm, 64 μm, 66 μm, 68 μm, 69 μm, etc., but not limited thereto.

By arranging the third heat dissipation holes 603 according to the above dimensions, the arrangement difficulty of the third heat dissipation holes 603 can be reduced while ensuring the heat dissipation performance of the third heat dissipation holes 603.

As shown in FIGS. 4 to 9, in some embodiments, at least part of the orthographic projection of the third heat dissipation hole 603 onto the base substrate 10 is located between the orthographic projection of the second low-level signal line onto the base substrate 10 and the orthographic projection of a corresponding first scanning line G1 onto the base substrate 10; and/or at least part of the orthographic projection of the third heat dissipation hole 603 onto the base substrate 10 is located between the orthographic projection of the second low-level signal line onto the base substrate 10 and the orthographic projection of the corresponding second scanning line G2 onto the base substrate 10.

The above-mentioned arrangement can dissipate heat near the display area 101 through the third heat dissipation hole 603, which is beneficial to further improve the display brightness uniformity of the display substrate.

As shown in FIGS. 4 to 9, in some embodiments, the heat dissipation hole structure 60 includes a plurality of fourth heat dissipation holes 604, where at least part of the orthographic projection of the fourth heat dissipation holes 604 onto the base substrate 10 is located between the orthographic projection of the second low-level signal line VGL2 onto the base substrate 10 and the display area 101; the fourth heat dissipation holes 604 and the third heat dissipation holes 603 are alternately arranged in the first direction.

Illustratively, the plurality of fourth heat dissipation holes 604 are aligned in the first direction. The plurality of fourth heat dissipation holes 604 are uniformly arranged in the first direction.

In the display substrate provided in the above-mentioned embodiment, at least part of the orthographic projection of the fourth heat dissipation holes 604 onto the base substrate 10 is arranged between the orthographic projection of the second low-level signal line VGL2 onto the base substrate 10 and the display area 101, and the heat near the display area 101 can be dissipated via the fourth heat dissipation hole 604, which is beneficial to further improve the display brightness uniformity of the display substrate.

In the display substrate provided in the above-mentioned embodiment, the fourth heat dissipation holes 604 and the third heat dissipation holes 603 are alternately arranged along the first direction, so that the third heat dissipation holes 603 and the fourth heat dissipation holes 604 can be uniformly distributed along the first direction, thereby better improving the heat dissipation performance of the heat dissipation hole structure 60.

As shown in FIGS. 4 to 9, in some embodiments, the orthographic projection of the fourth heat dissipation hole 604 onto the base substrate 10 is between orthographic projections of the second signal transmission line 72 and the third signal transmission line 73 that are adjacent onto the base substrate 10.

In the display substrate provided in the above-mentioned embodiment, there may be a relatively large layout space between the second signal transmission line 72 and the third signal transmission line 73 that are adjacent, and by arranging that the orthographic projection of the fourth heat dissipation hole 604 onto the base substrate 10 is located between the orthographic projections of the second signal transmission line 72 and the third signal transmission line 73 that are adjacent onto the base substrate 10, not only the layout difficulty of the fourth heat dissipation hole 604 is reduced, but also the fourth heat dissipation hole 604 can achieve a relatively large size. It is advantageous to improve the heat dissipation performance of the fourth heat dissipation hole 604.

As shown in FIGS. 4 to 9, in some embodiments, the orthographic projection of the fourth heat dissipation hole 604 onto the base substrate 10 is located between orthographic projections of a second signal transmission line 72 and a third signal transmission line 73 that are connected to connecting the same row of pixels onto the base substrate 10; or the orthographic projection of the fourth heat dissipation hole 604 onto the base substrate 10 is located between the orthographic projections of a first scanning line G1 and a second scanning line G2 that are connected to the same row of pixels onto the base substrate 10, for performing heat dissipation when the same row of pixels works. For example, the first scanning line G1 and the second scanning line G2 of the same row of pixels use the same sequence.

As shown in FIGS. 4 to 9, in some embodiments, the orthographic projection of the fourth heat dissipation hole 604 onto the base substrate 10 is a rectangle having a long side between 55 μm and 65 μm, which may include endpoints, and a short side between 30 μm and 40 μm, which may include endpoints.

Illustratively, the long side of the orthographic projection of the fourth heat dissipation hole 604 onto the base substrate 10 may take a value of: 57 μm, 59 μm, 60 μm, 62 μm, 64 μm, etc., but not limited thereto.

Illustratively, the short side of the orthographic projection of the fourth heat dissipation hole 604 onto the base substrate 10 may take a value of: 32 μm, 34 μm, 36 μm, 38 μm, 39 μm, etc., but not limited thereto.

By arranging the fourth heat dissipation holes 604 according to the above-mentioned dimensions, the layout difficulty of the fourth heat dissipation holes 604 can be reduced while ensuring the heat dissipation performance of the fourth heat dissipation holes 604.

As shown in FIGS. 4 to 9, in some embodiments, the heat dissipation hole structure 60 includes a plurality of fifth heat dissipation holes 605, an orthographic projection of at least part of the fifth heat dissipation holes 605 onto the base substrate 10 is located between the orthographic projection of the fourth heat dissipation holes 604 onto the base substrate 10 and the display area 101.

Illustratively, the area of an orthographic projections of at least one of the heat dissipation hole structures close to the display area 101 onto the base substrate onto the base substrate is greater than the area of the orthographic projection of a heat dissipation hole structure away from the display area 101 onto the base substrate, because heat dissipation is more required near the display area 101. For example, the area of the orthographic projection of the fifth heat dissipation hole 605 onto the base substrate 10 is greater than the area of the orthographic projection of the fourth heat dissipation hole 604 onto the base substrate 10.

Illustratively, the orthographic projection of the fifth heat dissipation hole 605 onto the base substrate 10 is at least partially offset or staggered from the orthographic projection of the fourth heat dissipation hole 604 onto the base substrate 10 in the first direction.

In the display substrate provided in the above-mentioned embodiment, at least part of the orthographic projection of the fifth heat dissipation hole 605 onto the base substrate 10 is arranged between the orthographic projection of the fourth heat dissipation hole 604 onto the base substrate 10 and the display area 101, and the heat in the vicinity of the display area 101 can be dissipated via the fifth heat dissipation hole 605, which is beneficial to further improve the display brightness uniformity of the display substrate.

As shown in FIGS. 4 to 9, in some embodiments, the orthographic projection of the fifth heat dissipation hole 605 onto the base substrate 10 is between orthographic projections of the first scanning line G1 and the second scanning line G2 that are adjacent onto the base substrate 10.

As shown in FIGS. 4 to 9, in some embodiments, the orthographic projection of the fifth heat dissipation hole 605 onto the base substrate 10 is located between orthographic projections of a first scanning line G1 and a second scanning line G2 that correspond to the same row of pixels onto the base substrate 10, so as to facilitate heat dissipation when the same row of pixels is operating. For example, the first scanning line G1 and the second scanning line G2 corresponding to the same row of pixels adopt the same timing sequence.

In the display substrate provided in the above-mentioned embodiments, there can exist a larger layout space between the first scanning line G1 and the second scanning line G2 that are adjacent. By arranging that the orthographic projection of the fifth heat dissipation hole 605 onto the base substrate 10 is located between orthographic projections of the first scanning line G1 and the second scanning line G2 that are adjacent onto the base substrate 10, not only the difficulty of arranging the fifth heat dissipation hole 605 is reduced, but also the fifth heat dissipation hole 605 can achieve a larger size, which is advantageous for improving the heat dissipation performance of the fifth heat dissipation hole 605.

As shown in FIGS. 4 to 9, in some embodiments, the orthographic projection of the fifth heat dissipation hole 605 onto the base substrate 10 is a rectangle, the long side of which is between 170 μm and 180 μm and may include endpoints, and the short side of which is between 110 μm and 120 μm and may include endpoints.

By way of example, the length of the long side of the orthographic projection of the fifth heat dissipation hole 605 onto the base substrate 10 may take a value: 172 μm, 174 μm, 176 μm, 178 μm, 179 μm, etc., but not limited thereto.

Illustratively, the length of the short side of the orthographic projection of the fifth heat dissipation hole 605 onto the base substrate 10 may take a value: 112 μm, 114 μm, 116 μm, 118 μm, 119 μm, etc., but not limited thereto.

By arranging the fifth heat dissipation holes 605 according to the above dimensions, it is possible to reduce the layout difficulty of the fifth heat dissipation holes 605 while ensuring the heat dissipation performance of the fifth heat dissipation holes 605.

Figure 11:
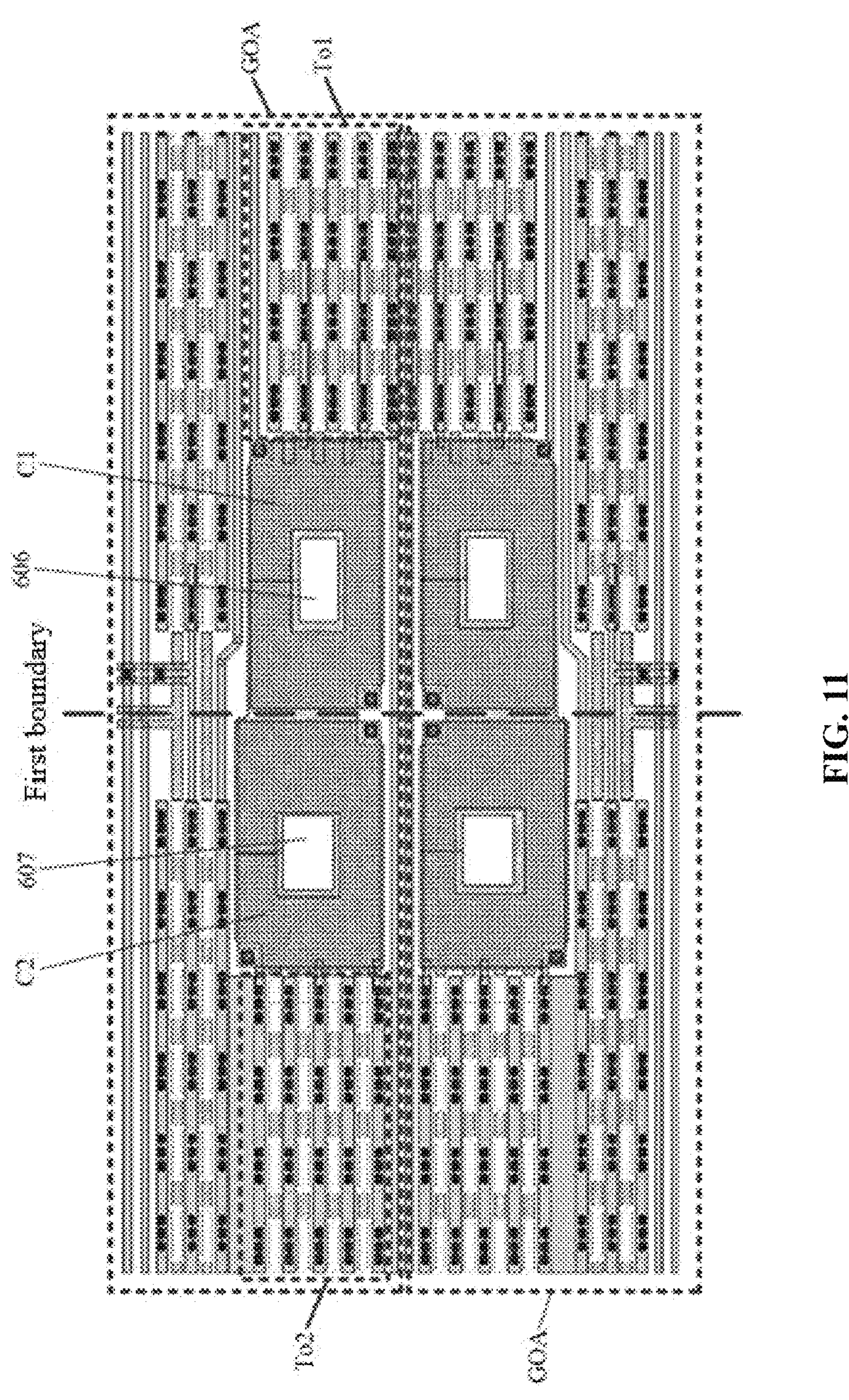
FIG. 11 is a schematic layout diagram of a sixth heat dissipation hole and a seventh heat dissipation hole provided in an embodiment of the present disclosure.
Figure 12:
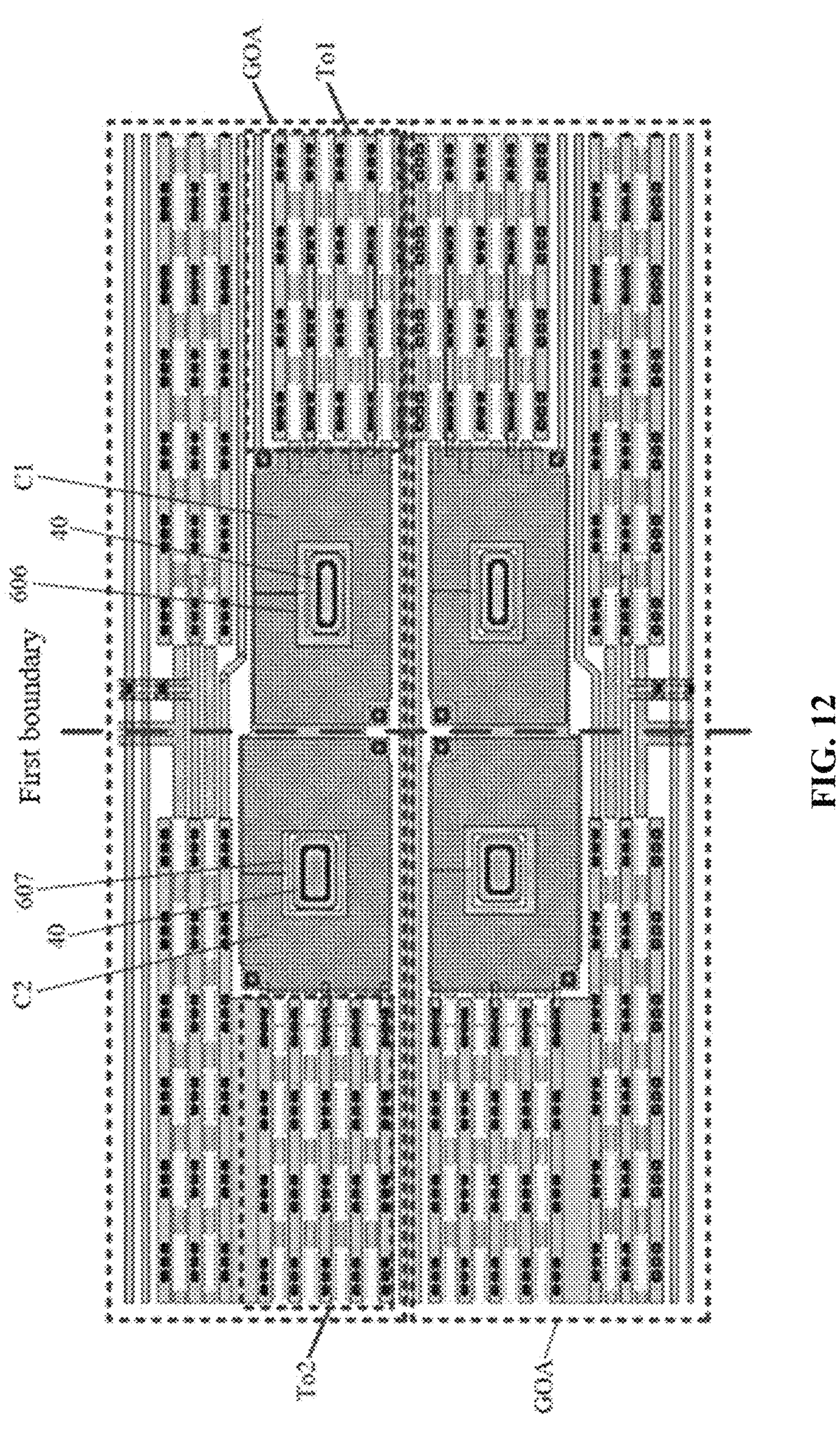
FIG. 12 is a schematic diagram of a sixth heat dissipation hole and a seventh heat dissipation hole provided with a heat conduction pattern according to an embodiment of the present disclosure.

As shown in FIGS. 11 and 12, in some embodiments, the gate driving circuit GOA includes a first output transistor To1 and a first capacitor C1, a first plate of the first capacitor C1 is coupled to the gate electrode of the first output transistor To1, and a second plate of the first capacitor C1 is coupled to a second electrode of the first output transistor To1.

The heat dissipation hole structure 60 includes a plurality of sixth heat dissipation holes 606, and the sixth heat dissipation hole 606 penetrates through the first plate and the second plate.

Illustratively, the larger the area of the first plate and the second plate is, the larger the area of the orthographic projection of the sixth heat dissipation hole 606 onto the base substrate is.

Illustratively, the gate driving circuit GOA includes a first gate driving signal output terminal, a first electrode of the first output transistor To1 is coupled to a corresponding clock signal line, and a second electrode of the first output transistor To is coupled to the first gate driving signal output terminal.

Illustratively, the orthographic projection of the first plate onto the base substrate 10 at least partially overlaps the orthographic projection of the second plate onto the base substrate 10.

Illustratively, one of the first plate and the second plate is fabricated by using the gate metal layer and the other of the first plate and the second plate is fabricated by using the source and drain metal layer.

Since the first capacitor C1 is coupled to the first output transistor To1, the sixth heat dissipation hole 606 is arranged to penetrate the first plate and the second plate, so that the sixth heat dissipation hole 606 can dissipate the heat generated by the first capacitor C1 and the first output transistor To1, thereby better improving the heat dissipation effect on the display substrate.

As shown in FIGS. 11 and 12, in some embodiments, the gate driving circuit GOA includes a second output transistor To2 and a second capacitor C2, a third plate of the second capacitor C2 is coupled to a gate electrode of the second output transistor To2, and a fourth plate of the second capacitor C2 is coupled to a second electrode of the second output transistor To2;

The heat dissipation hole structure 60 includes a plurality of seventh heat dissipation holes 607, and the seventh heat dissipation hole penetrates through the third plate and the fourth plate.

Illustratively, the larger the area of the third plate and the fourth plate is, the larger the area of the orthographic projection of the seventh heat dissipation hole 607 onto the base substrate is.

Illustratively, the gate driving circuit GOA includes a second gate driving signal output terminal, a first electrode of the second output transistor To2 is coupled to a corresponding clock signal line, and a second electrode of the second output transistor To2 is coupled to the second gate driving signal output terminal.

Illustratively, an orthographic projection of the third plate onto the base substrate 10 at least partially overlaps an orthographic projection of the fourth plate onto the base substrate 10.

Illustratively, one of the third plate and the fourth plate is fabricated by using the gate metal layer and the other of the third plate and the fourth plate is fabricated by using the source and drain metal layer.

Since the second capacitor C2 is coupled to the second output transistor To2, the seventh heat dissipation hole 607 is arranged to penetrate the third plate and the fourth plate, so that the seventh heat dissipation hole 607 can dissipate the heat generated by the second capacitor C2 and the second output transistor To2, thereby better improving the heat dissipation effect on the display substrate.

As shown in FIGS. 11 and 12, in some embodiments, the gate driving circuit GOA includes a first output transistor To1 and a first capacitor C1, a first plate of the first capacitor C1 is coupled to the gate electrode of the first output transistor To1, and a second plate of the first capacitor C1 is coupled to a second electrode of the first output transistor To1.

The first boundary of the cathode layer 20 is located between the orthographic projection of the first plate onto the base substrate 10 and the orthographic projection of the third plate onto the base substrate 10.

Illustratively, the cathode layer 20 is filled inside one of the sixth heat dissipation hole 606 and the seventh heat dissipation hole 607.

Illustratively, a heat conduction pattern 40 is provided in the sixth heat dissipation hole 606 and/or the seventh heat dissipation hole 607, and the heat conduction pattern 40 contacts or does not contact the inner wall of the sixth heat dissipation hole 606 and/or the seventh heat dissipation hole 607.

As shown in FIGS. 11 and 12, in some embodiments, the orthographic projection of the first capacitor C1 onto the base substrate 10 and the orthographic projection of the second capacitor C2 onto the base substrate 10 are both disposed between the orthographic projection of the first output transistor To1 onto the base substrate 10 and the orthographic projection of the second output transistor To2 onto the base substrate 10.

The above-mentioned arrangement enables the sixth heat dissipation hole 606 and the seventh heat dissipation hole 607 to better dissipate the heat generated by the first capacitor C1, the second capacitor C2, the first output transistor To1 and the second output transistor To2 during operation, thereby better improving the heat dissipation effect on the display substrate.

Figure 13:
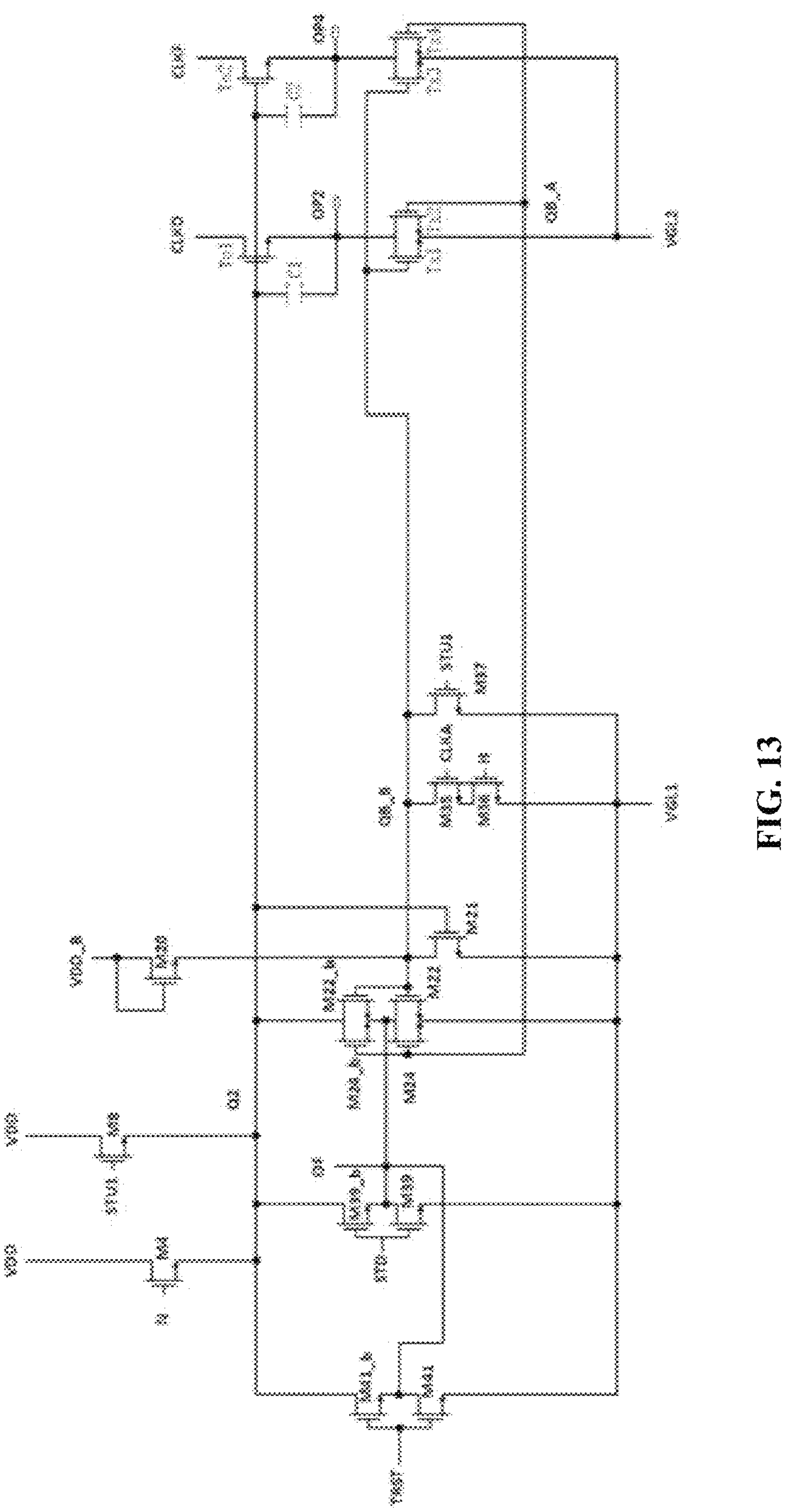
FIG. 13 is a circuit diagram of a gate driving circuit provided in an embodiment of the present disclosure.

As shown in FIG. 13, a circuit configuration diagram of the gate driving circuit is illustrated, and the circuit configuration of the gate driving circuit employed in the display substrate provided by the embodiments of the present disclosure is not limited thereto, and a simpler or more complex circuit configuration may be employed.

FIG. 13 shows that the gate driving circuit includes a fourth transistor M4, an eighth transistor M8, a twentieth transistor M20, a twenty-first transistor M21, a twenty-second transistor M22, a twenty-third transistor M22_b, a twenty-fourth transistor M24, a twenty-fifth transistor M24_b, a thirty-fifth transistor M35, a thirty-sixth transistor M36, a thirty-seventh transistor M37, a thirty-ninth transistor M39, a forty transistor M39_b, a forty-first transistor M41, a forty-second transistor M41_b, a first output transistor To1, a second output transistor To2, a first capacitor C1, the second capacitor C2, a first pull-down transistor Tx1, a second pull-down transistor Tx2, a third pull-down transistor Tx3 and a fourth pull-down transistor Tx4.

FIG. 13 also shows: a power supply line VDD, a second power supply line VDD_B, a first input signal line STU1, a first reset line TRST, a second reset line STD, a first clock signal line CLKA, a second clock signal line CLKD, a third clock signal line CLKF, a first low-level signal line VGL1, a second low-level signal line VGL2, a first node N, a second node Q2, a third node OF, a fourth node QB_B, a fifth node H, a sixth node QB_A, a first gate driving signal output terminal OP2, and a second gate driving signal output terminal OP4.

In some embodiments, at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607 satisfies a condition, and the condition is that an orthographic projection at least part of the hole onto the base substrate 10 between the orthographic projection of the gate driving circuit GOA onto the base substrate 10 and the orthographic projection of the sub-pixel 50 onto the base substrate 10.

In some embodiments, at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607 is located in the border area 102.

In some embodiments, a part of the cathode layer 20 is located inside at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607.

In some embodiments, inside at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607, the cathode layer 20 is in contact with the base substrate 10.

In some embodiments, the heat conduction pattern is located inside at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607, the heat conduction pattern is in contact with the cathode layer 20 and the base substrate 10.

In some embodiments, inside at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607, a corner part of the orthographic projection of the heat conduction pattern onto the base substrate 10 adopts a chamfering design X1.

In some embodiments, inside at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607, the heat conduction pattern includes at least two heat conduction sub-patterns that are stacked, one of the heat conduction sub-patterns closest to the base substrate 10 is in contact with the base substrate 10, and one of the heat conduction sub-patterns farthest from the base substrate 10 is in contact with the cathode layer 20.

In some embodiments, inside at least one of the first heat dissipation hole 601, the second heat dissipation hole 602, the third heat dissipation hole 603, the fourth heat dissipation hole 604, the fifth heat dissipation hole 605, the sixth heat dissipation hole 606 and the seventh heat dissipation hole 607, the heat conduction pattern includes a first heat conduction sub-pattern 41 and a second heat conduction sub-pattern 42 that are stacked, where the first heat conduction sub-pattern 41 is in contact with the base substrate 10, and the second heat conduction sub-pattern 42 is in contact with the cathode layer 20; the first heat conduction sub-pattern 41 is arranged in the same layer and made of the same material as the gate metal layer of the display substrate, and the second heat conduction sub-pattern 42 is arranged in the same layer and made of the same material as the source and drain metal layer of the display substrate.

In some embodiments, at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607 can penetrate through the buffer layer, the interlayer insulating layer, the passivation layer, the organic insulating layer, and the pixel definition layer.

In some embodiments, a portion of the metal encapsulation layer 30 is located inside at least one of the first heat dissipation hole 601, the second heat dissipation hole 602, the third heat dissipation hole 603, the fourth heat dissipation hole 604, the fifth heat dissipation hole 605, the sixth heat dissipation hole 606, and the seventh heat dissipation hole 607.

Embodiments of the present disclosure also provide a display device including the display substrate provided by the above embodiments.

It is to be noted that the display device may be: any product or component with a display function, such as a television, a display, a digital photo frame, a mobile phone, a tablet computer, and among others, the display device further includes a flexible circuit board, a printed circuit board and a back panel.

In the display substrate provided in the above-mentioned embodiment, at least part of the orthographic projection of the heat dissipation hole structure 60 onto the base substrate 10 is arranged between the orthographic projection of the gate driving circuit GOA onto the base substrate 10 and the orthographic projection of the sub-pixel 50 onto the base substrate 10, so that the gate driving circuit GOA can effectively dissipate heat through the heat dissipation hole structure 60, and the heat generated during the operation of the gate driving circuit GOA is avoided to have an influence on the sub-pixel 50, thereby ensuring the uniformity of the display brightness of the sub-pixel 50 in the display substrate.

Therefore, the display device provided by this embodiment also has the above-described advantageous effects when including the above-described display substrate, and the description thereof will not be repeated herein.

It is to be noted that the signal line extending in a certain direction means that: the signal line includes a main part and a secondary part connected to the main part, the main part being a line, a line segment or a bar-shaped body, the main part extending in the certain direction, and the length of the main part extending in the certain direction being greater than the length of the secondary part extending in another direction.

It is to be noted that the "same layer" in the embodiments of the present disclosure may refer to a film layer on the same structural layer. Or, for example, the film layer in the same layer may be a layer structure formed by forming a film layer for forming a specific pattern using the same film forming process and then patterning the film layer by one patterning process using the same mask plate. Depending on the particular pattern, a single patterning process may include multiple exposure, development, or etching processes, and the particular pattern in the resulting layer structure may or may not be continuous. The particular patterns may also be at different heights or have different thicknesses.

In the various method embodiments of the present disclosure, the serial number of each step cannot be used to define the order of each step, and for a person of ordinary skill in the art, without involving any inventive effort, changes in the order of each step are also within the scope of the present disclosure.

It should be noted that the various embodiments described herein are described in a progressive manner with reference to the same or similar parts throughout the various embodiments, with each embodiment focusing on differences from the other embodiments. In particular, the embodiments are described more simply because they are approximately similar to the product embodiments, with reference to the partial description of the product embodiments.

Unless defined otherwise, technical or scientific terms used in the present disclosure shall have the ordinary meaning as understood by one of ordinary skill in the art to which this disclosure belongs. Such terms as "first", "second" used in the present disclosure does not denote any order, quantity, or importance, but rather is used to distinguish one element from another. Such terms as "include" or "comprise" means that the presence of an element or item preceding the word covers the presence of the element or item listed after the word and equivalents thereof, but does not exclude other elements or items. Such terms as "connected" or "connected" are not limited to physical or mechanical connections, but may include electrical connections, whether direct or indirect. Such terms as "upper", "lower", "left", "right" are used only to indicate relative positional relationships that may change accordingly when the absolute position of the object being described changes.

It should be understood that when an element such as a layer, film, region, or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The above are only specific embodiments of the present disclosure, but the protection scope of the present disclosure is not limited thereto. Anyone skilled in the art can easily think of changes or substitutions within the technical scope disclosed in the present disclosure, which shall fall within the protection scope of the present disclosure. Therefore, the protection scope of the present disclosure should be subjected to the protection scope of the claims.

What is claimed is:

1. A display substrate, comprising: a base substrate, and a gate driving circuit and a plurality of sub-pixels arranged on the base substrate;

wherein the display substrate further comprises a heat dissipation hole structure, and at least part of an orthographic projection of the heat dissipation hole structure onto the base substrate is located between an orthographic projection of the gate driving circuit onto the base substrate and an orthographic projection of the sub-pixels onto the base substrate, wherein the gate driving circuit comprises a first output transistor and a first capacitor, a first plate of the first capacitor is coupled to a gate electrode of the first output transistor, and a second plate of the first capacitor is coupled to a second electrode of the first output transistor;

the heat dissipation hole structure comprises a plurality of sixth heat dissipation holes, and the sixth heat dissipation hole penetrates through the first plate and the second plate.

2. The display substrate according to claim 1, wherein the display substrate comprises a display area and a border area surrounding the display area, the plurality of sub-pixels are located in the display area, and the gate driving circuit and the heat dissipation hole structure are located in the border area.

3. The display substrate according to claim 2, wherein the display substrate further comprises a cathode layer, the cathode layer is located on a side of the gate driving circuit facing away from the base substrate, and a part of the cathode layer is located in the heat dissipation hole structure.

4. The display substrate according to claim 3, wherein the part of the cathode layer located in the heat dissipation hole structure is in contact with the base substrate.

5. The display substrate according to claim 3, wherein the display substrate further comprises a heat conduction pattern, the heat conduction pattern is located in the heat dissipation hole structure, the heat conduction pattern is located between the cathode layer and the base substrate, and the heat conduction pattern is in contact with the cathode layer and the base substrate.

6. The display substrate according to claim 5, wherein a chamfering design is used for a corner part of an orthographic projection of the heat conduction pattern onto the base substrate; and/or wherein the heat conduction pattern includes at least two heat conduction sub-patterns that are stacked, one of the heat conduction sub-patterns closest to the base substrate is in contact with the base substrate, and one of the heat conduction sub-patterns farthest from the base substrate is in contact with the cathode layer; and/or wherein the heat conduction pattern comprises a first heat conduction sub-pattern and a second heat conduction sub-pattern that are stacked, the first heat conduction sub-pattern is in contact with the base substrate, and the second heat conduction sub-pattern is in contact with the cathode layer;

the first heat conduction sub-pattern is arranged in a same layer and made of a same material as a gate metal layer of the display substrate, and the second heat conduction sub-pattern is arranged in a same layer and made of a same material as a source and drain metal layer of the display substrate; and an area of the part of the cathode layer located in the heat dissipation hole structure is greater than an area of the first heat conduction sub-pattern, and is greater than an area of the second heat conduction sub-pattern.

7. The display substrate according to claim 3, wherein the display substrate further comprises:

a metal encapsulation layer, wherein the metal encapsulation layer is located on a side of the cathode layer facing away from the base substrate, and a part of the metal encapsulation layer is located in the heat dissipation hole structure.

8. The display substrate according to claim 1, wherein the display substrate comprises a buffer layer, an interlayer insulating layer, a passivation layer, an organic insulating layer and a pixel definition layer that are stacked and arranged on the base substrate in sequence in a direction away from the base substrate, and the heat dissipation hole structure penetrates through the buffer layer, the interlayer insulating layer, the passivation layer, the organic insulating layer and the pixel definition layer.

9. The display substrate according to claim 1, wherein the display substrate further comprises a first low-level signal line and a second low-level signal line, the first low-level signal line comprises at least a portion extending along a first direction, the second low-level signal line comprises at least a portion extending along the first direction, and an orthographic projection of the second low-level signal line onto the base substrate is located between the display area and an orthographic projection of the first low-level signal line onto the base substrate;

the heat dissipation hole structure comprises a plurality of first heat dissipation holes, and at least part of an orthographic projection of the first heat dissipation hole onto the base substrate is located between the orthographic projection of the gate driving circuit onto the base substrate and the orthographic projection of the first low-level signal line onto the base substrate;

wherein the display substrate further comprises a plurality of first signal transmission lines, a plurality of second signal transmission lines and a plurality of first scanning lines, the first signal transmission line comprises at least a portion extending along a second direction, the second signal transmission line comprises at least a portion extending along the second direction, the first scanning line comprises at least a portion extending along the second direction, and the second direction intersects with the first direction;

the first signal transmission line is coupled to a corresponding one of the gate driving circuit and the first low-level signal line, and the second signal transmission line is coupled to a corresponding one of the gate driving circuit and a corresponding one of the first scanning lines;

the orthographic projection of the first heat dissipation hole onto the base substrate is located between orthographic projections of one of the first signal transmission lines and one of the second signal transmission lines that are adjacent onto the base substrate.

10. The display substrate according to claim 9, wherein the orthographic projection of the first heat dissipation hole onto the base substrate is a rectangle, a long side of the rectangle has a length between 145 μm and 155 μm, and a short side of the rectangle has a length between 25 μm and 35 μm; and/or wherein the gate driving circuit comprises pull-down transistors, and at least part of the orthographic projection of the first heat dissipation hole onto the base substrate is located between an orthographic projection of a corresponding one of the pull-down transistors onto the base substrate and the orthographic projection of the first low-level signal line onto the base substrate; and/or wherein the gate driving circuit comprises output transistors, and at least part of the orthographic projection of the first heat dissipation hole onto the base substrate is located between orthographic projections of adjacent two of the output transistors onto the base substrate.

11. The display substrate according to claim 9, wherein the heat dissipation hole structure comprises a plurality of second heat dissipation holes, at least part of an orthographic projection of the second heat dissipation hole onto the base substrate is located between the orthographic projection of the gate driving circuit onto the base substrate and the orthographic projection of the first low-level signal lines onto the base substrate, and the second heat dissipation holes and the first heat dissipation holes are alternately arranged along the first direction;

wherein the display substrate further comprises a plurality of first signal transmission lines, a plurality of third signal transmission lines and a plurality of second scanning lines, the first signal transmission line comprises at least a portion extending along a second direction, the third signal transmission line comprises at least a portion extending along the second direction, the second scanning line comprises at least a portion extending along the second direction, and the second direction intersects with the first direction;

the first signal transmission line is coupled to a corresponding one of the gate driving circuit and the first low-level signal line, and the third signal transmission line is coupled to a corresponding one of the gate driving circuit and a corresponding one of the second scanning lines;

the orthographic projection of the second heat dissipation hole onto the base substrate is located between orthographic projections of one of the first signal transmission lines and one of the third signal transmission lines that are adjacent onto the base substrate.

12. The display substrate according to claim 11, wherein the orthographic projection of the second heat dissipation hole onto the base substrate is a rectangle, a long side of the rectangle has a length between 145 μm and 155 μm, and a short side of the rectangle has a length between 10 μm and 20 μm; and/or wherein the gate driving circuit comprises pull-down transistors, and at least part of the orthographic projection of the second heat dissipation hole onto the base substrate is located between an orthographic projection of a corresponding one of the pull-down transistors onto the base substrate and the orthographic projection of the first low-level signal line onto the base substrate; and/or wherein the gate driving circuit comprises output transistors, and at least part of the orthographic projection of the second heat dissipation hole onto the base substrate is located between orthographic projections of adjacent two of the output transistors onto the base substrate.

13. The display substrate according to claim 9, wherein the heat dissipation hole structure comprises a plurality of third heat dissipation holes, and at least part of an orthographic projection of the third heat dissipation hole onto the base substrate is located between the display area and the orthographic projection of the second low-level signal line onto the base substrate.

14. The display substrate according to claim 13, wherein the display substrate further comprises a plurality of second signal transmission lines, a plurality of third signal transmission lines, a plurality of first scanning lines and a plurality of second scanning lines; the second signal transmission line comprises at least a portion extending along a second direction, the third signal transmission line comprises at least a portion extending along the second direction, the first scanning line comprises at least a portion extending along the second direction, and the second scanning line comprises at least a portion extending along the second direction; the second direction intersects the first direction;

the second signal transmission line is coupled to a corresponding one of the gate driving circuit and a corresponding one of the first scanning lines, and the third signal transmission line is coupled to a corresponding one of the gate driving circuit and a corresponding one of the second scanning lines;

the orthographic projection of the third heat dissipation hole onto the base substrate is located between orthographic projections of one of the second signal transmission lines and one of the third signal transmission lines that are adjacent onto the base substrate.

15. The display substrate according to claim 14, wherein the orthographic projection of the third heat dissipation hole onto the base substrate is a rectangle, a long side of the rectangle has a length between 150 μm and 160 μm, and a short side of the rectangle has a length between 60 μm and 70 μm; and/or wherein at least part of the orthographic projection of the third heat dissipation hole onto the base substrate is located between the orthographic projection of the second low-level signal line onto the base substrate and an orthographic projection of a corresponding one of the first scanning lines onto the base substrate; and/or at least part of the orthographic projection of the third heat dissipation hole onto the base substrate is located between the orthographic projection of the second low-level signal line onto the base substrate and an orthographic projection of a corresponding one of the second scanning lines onto the base substrate.

16. The display substrate according to claim 14, wherein the heat dissipation hole structure comprises a plurality of fourth heat dissipation holes, and at least part of the orthographic projection of the fourth heat dissipation hole onto the base substrate is located between the display area and the orthographic projection of the second low-level signal line onto the base substrate; the fourth heat dissipation holes and the third heat dissipation holes are alternately arranged in the first direction;

wherein the orthographic projection of the fourth heat dissipation hole onto the base substrate is located between orthographic projections of one of the second signal transmission lines and one of the third signal transmission lines that are adjacent onto the base substrate; and/or wherein the orthographic projection of the fourth heat dissipation hole onto the base substrate is a rectangle, a long side of the rectangle has a length between 55 μm and 65 μm, and a short side of the rectangle has a length between 30 μm and 40 μm.

17. The display substrate according to claim 16, wherein the heat dissipation hole structure comprises a plurality of fifth heat dissipation holes, at least part of the orthographic projection of the fifth heat dissipation hole onto the base substrate is located between the display area and the orthographic projection of the fourth heat dissipation hole onto the base substrate;

wherein the orthographic projection of the fifth heat dissipation hole onto the base substrate is located between orthographic projections of one of the first scanning lines and one of the second scanning lines that are adjacent onto the base substrate; and/or wherein the orthographic projection of the fifth heat dissipation hole onto the base substrate is a rectangle, a long side of the rectangle has a length between 170 μm and 180 μm, and a short side of the rectangle has a length between 110 μm and 120 μm.

18. The display substrate according to claim 1, wherein the gate driving circuit comprises a second output transistor and a second capacitor, a third plate of the second capacitor is coupled to a gate electrode of the second output transistor, and a fourth plate of the second capacitor is coupled to a second electrode of the second output transistor;

the heat dissipation hole structure comprises a plurality of seventh heat dissipation holes, and the seventh heat dissipation hole penetrates through the third plate and the fourth plate;

wherein the gate driving circuit comprises a first output transistor and a first capacitor, a first plate of the first capacitor is coupled to a gate electrode of the first output transistor, and a second plate of the first capacitor is coupled to a second electrode of the first output transistor;

a first boundary of the cathode layer is between an orthographic projection of the first plate onto the base substrate and an orthographic projection of the third plate onto the base substrate; and/or wherein an orthographic projection of the first capacitor onto the base substrate and an orthographic projection of the second capacitor onto the base substrate are located between an orthographic projection of the first output transistor onto the base substrate and an orthographic projection of the second output transistor onto the base substrate.

19. A display device, comprising the display substrate according to claim 1.

* * * * *